(12) United States Patent
Adriance et al.

(10) Patent No.: US 6,484,927 B1
(45) Date of Patent: Nov. 26, 2002

(54) METHOD AND APPARATUS FOR BALLING AND ASSEMBLING BALL GRID ARRAY AND CHIP SCALE ARRAY PACKAGES

(75) Inventors: James H. Adriance, Vestal, NY (US); Koen Gieskes, Binghamton, NY (US); Willhelm Prinz von Hessen, Binghamton, NY (US)

(73) Assignee: Delaware Capital Formation Corporation, Wilmington, DE (US)

( * ) Notice: Subject to any disclaimer, the term of this patent is extended or adjusted under 35 U.S.C. 154(b) by 0 days.

(21) Appl. No.: 09/434,468

(22) Filed: Nov. 5, 1999

(51) Int. Cl.⁷ ............................................. B23K 31/02
(52) U.S. Cl. .................................... 228/245; 228/248.1
(58) Field of Search .......................... 228/245, 180.22, 228/248.1; 438/127, 616, 613, 615; 257/737, 738

(56) References Cited

U.S. PATENT DOCUMENTS

| | | | |
|---|---|---|---|
| 5,219,117 A | | 6/1993 | Lin |
| 5,275,330 A | * | 1/1994 | Isaacs et al. |
| 5,431,332 A | * | 7/1995 | Kirby et al. |
| 5,447,266 A | * | 9/1995 | Misono |
| 5,460,316 A | * | 10/1995 | Hefele |
| 5,607,099 A | | 3/1997 | Yeh et al. |
| 5,637,535 A | * | 6/1997 | Matsuda et al. |
| 5,643,831 A | | 7/1997 | Ochiai et al. |
| 5,658,827 A | | 8/1997 | Aulicino et al. |
| 5,749,614 A | | 5/1998 | Reid et al. |
| 5,890,283 A | * | 4/1999 | Sakemi et al. |
| 5,930,603 A | * | 7/1999 | Tsuji et al. |
| 6,030,889 A | * | 2/2000 | Aulicino et al. |
| 6,090,301 A | * | 7/2000 | Mizukoshi et al. |
| 6,169,022 B1 | * | 1/2001 | Saitou |

FOREIGN PATENT DOCUMENTS

| | | |
|---|---|---|
| EP | 0 307 591 A2 | 3/1989 |
| EP | 0 852 395 A2 | 8/1998 |

OTHER PUBLICATIONS

"Investigation of a Low Cost Solder Bumping Technique for Flip–Chip Interconnection" by D.A. Hutt, et al., *1999 IEEE/CPMT International Electronics Manufacturing Technology Symposium*, pp. 334–342.

* cited by examiner

Primary Examiner—M. Alexandra Elve
Assistant Examiner—Jonathan Johnson
(74) Attorney, Agent, or Firm—Finnegan, Henderson, Farabow, Garrett & Dunner LLP

(57) ABSTRACT

A method and apparatus are provided for attaching conductive materials to a substrate and for attaching a semiconductor chip to a substrate. A pallet is provided with pockets to hold the conductive materials, the substrate is placed over the pallet, and the semiconductor chip is placed over the substrate. The assembled semiconductor package is then placed in a heating oven or reflowed and the conductive materials and semiconductor chip are simultaneously attached to the substrate. Also provided is a stencil for varying the pockets into which the conductive materials are placed. In uses involving the stencil, a pallet with a full array of pockets is used and a stencil with holes corresponding to the desired pattern of application of the conductive materials is placed over the pallet. When the conductive materials are applied over the stencil, they fill only those pockets in the pallet that correspond to the desired pattern of application.

56 Claims, 20 Drawing Sheets

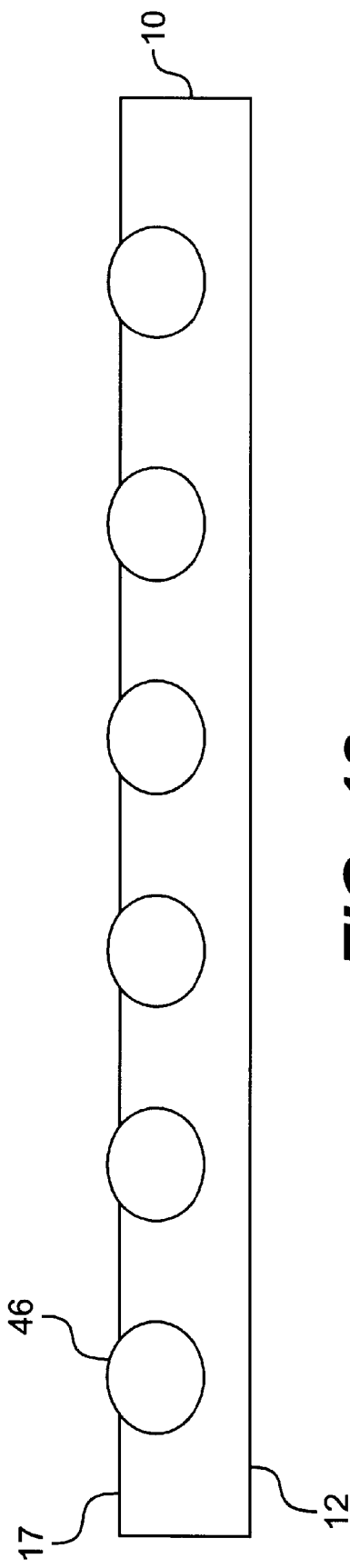
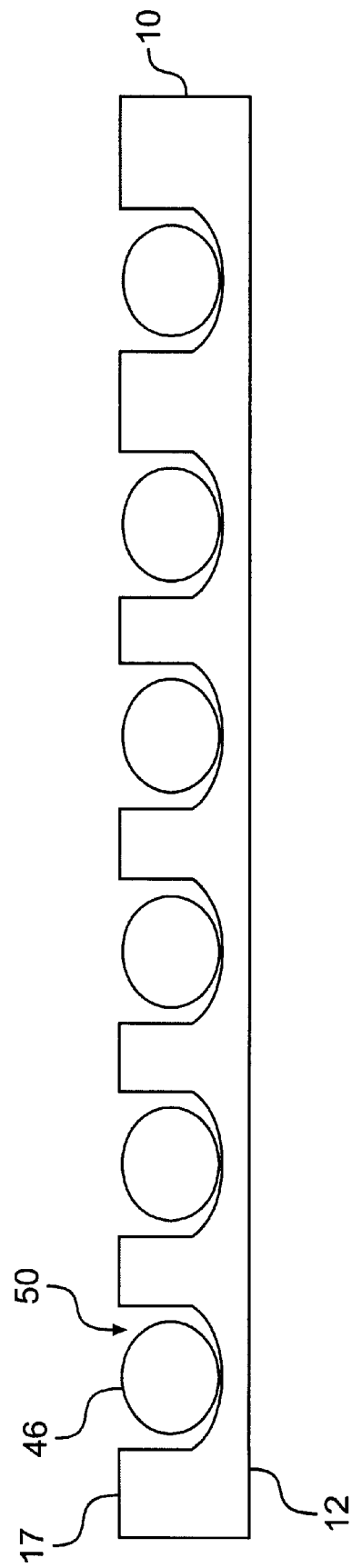
FIG. 12a
FIG. 12b

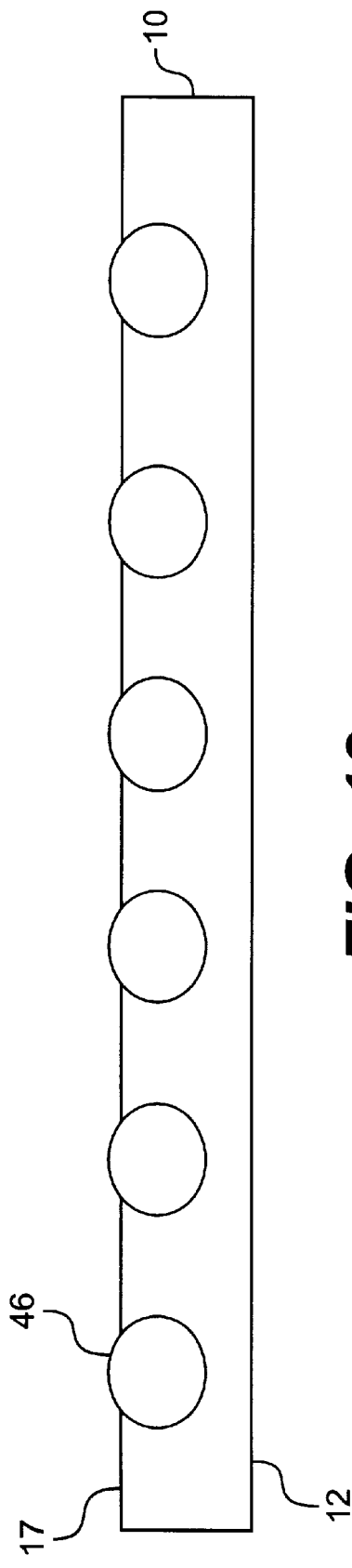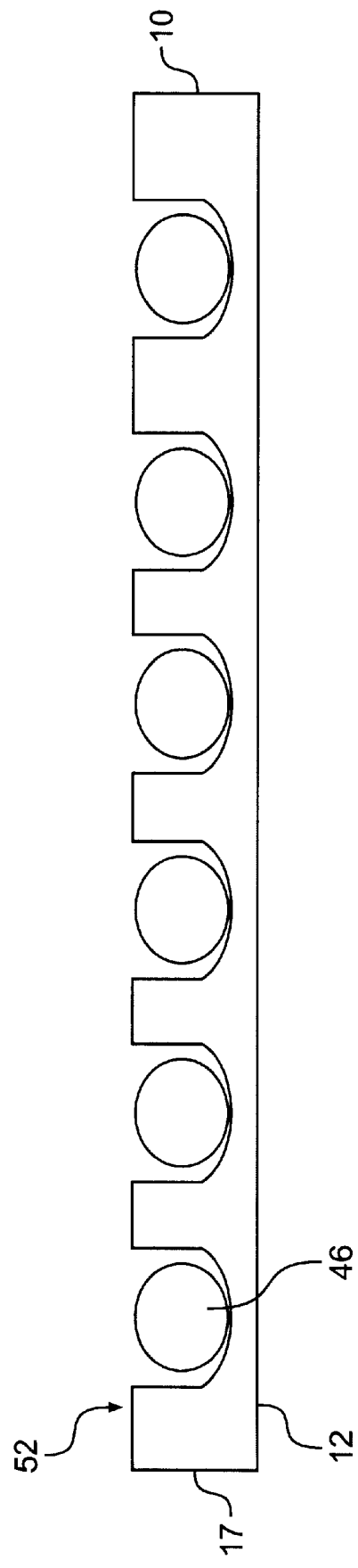

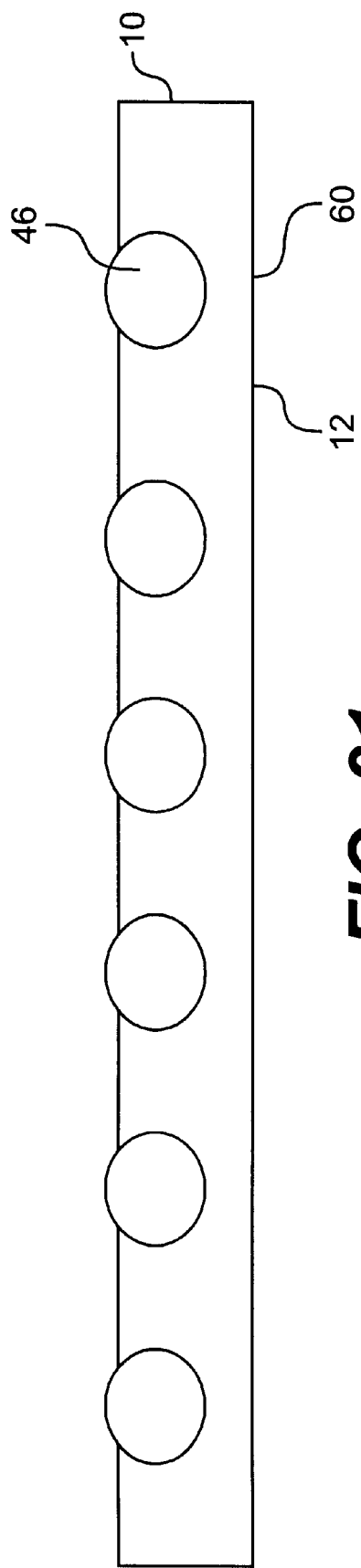
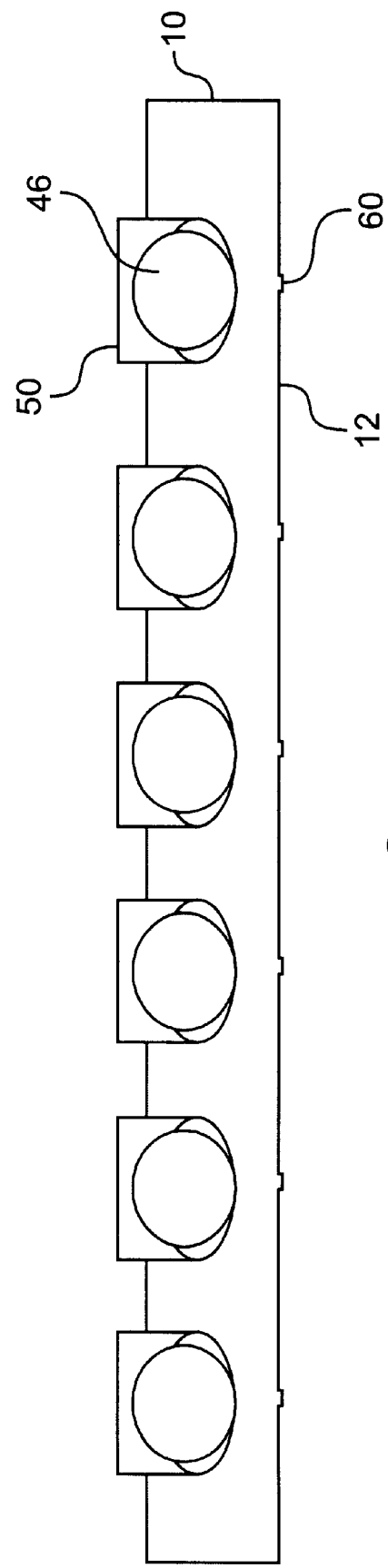
FIG. 21
FIG. 22

METHOD AND APPARATUS FOR BALLING AND ASSEMBLING BALL GRID ARRAY AND CHIP SCALE ARRAY PACKAGES

BACKGROUND OF THE INVENTION

1. Field of the Invention

The present invention relates to the assembly of semiconductor packages and, in particular, to an apparatus and method for efficiently assembling semiconductor packages.

2. Background of Related Art

Semiconductor chips are used in various electrical and electronic products, such as cellular phones and computers. The chips are able to interconnect millions of transistors on a surface with an area as small as 1 centimeter squared, thereby enabling designers to integrate very sophisticated and complex functions in an efficient physical device. In order to create a suitable electrical interface for the tiny chips and the products in which they are used, manufacturers use various techniques to attach the chips to intermediate mediums that are capable of forming electrical connections with both the chips and the products.

These intermediate mediums typically are nonconductive rectangular plates, sometimes called substrates, that have conductive pads on both plate surfaces. A semiconductor chip is attached to one plate surface of a substrate and forms an electrical connection with the conductive pads on that plate surface. A conductive material, such as solder, is attached to the conductive pads on the other plate surface to facilitate the forming of an electrical connection with the product in which the chip is used. The conductive pads on both sides of the plate also form electrical connections with each other, thus completing the electrical connection between the semiconductor chip and the product. The combination of the substrate and the semiconductor chip is typically referred to as a semiconductor package, a ball grid array ("BGA") package, or a chip scale array package ("CSP"), and as a unit, is ready to be used in its designated product.

During the production of semiconductor packages, manufacturers typically attach the conductive material and the semiconductor chip to the substrate in several separate steps. For example, a manufacturer might place solder, in the form of individual solder balls, onto a substrate so that the solder balls are aligned with respective conductive pads, place the substrate into a heating oven to melt the solder balls onto the conductive pads on that side of the substrate, remove the substrate with the attached solder, flip the substrate over, place the semiconductor chip with pre-formed solder bumps onto the other side of the substrate so that the pre-formed solder bumps on the semiconductor chip are aligned with the conductive pads on the substrate, and send the package into a heating oven again, to attach the semiconductor chip to the substrate. Alternatively, a manufacturer might practice the same process in reverse, i.e., place the semiconductor chip with solder bumps on the substrate, heat the chip and substrate, flip the substrate over, place solder balls onto the substrate, and send the package into the heating oven again, to attach the solder balls to the substrate.

Either process requires two separate passes through the heating oven, first to melt the solder balls onto the conductive pads on one side of the substrate, and then to attach the semiconductor chip to the other side of the substrate. The use of two separate passes is necessary due to the fact that something is being attached to both sides of the substrate and gravity is affecting the overall assembly. If the solder balls were placed on the top surface of the substrate, for example, and then the substrate was flipped over without first being passed through a heating oven, the solder balls would fall off. Similarly, if the semiconductor chip was placed on the top surface of the substrate and then the substrate was flipped over, the semiconductor chip would fall off.

While necessary, the double pass through the heating oven is more costly and time consuming to the manufacturer than a single pass would be. If, for example, more than one heating oven is used for the two separate heating passes, more capital expenditure, from the manufacturer's standpoint, is required. A manufacturer would like ideally to use as few machines as possible. The use of multiple passes through heating ovens also causes additional handling of the products, decreases throughput, and increases idle inventory. All of these factors contribute to the costliness of the manufacturing process. The extra pass through a heating oven also increases the likelihood of damaging the substrate, further complicating and retarding the process by lowering package reliability.

In addition, in conventional processes, the step of attaching the individual solder balls to their respective conductive pads on the substrate requires precision. The requisite amount of precision makes this step in the process of manufacturing semiconductor packages also expensive and time consuming. There exists a need, therefore, for an apparatus and method for more efficiently manufacturing semiconductor packages by reducing the number of required passes through a heating oven from two to one and by facilitating the attachment of solder to conductive pads on a substrate.

SUMMARY OF THE INVENTION

In order to overcome the disadvantages of the prior art and in accordance with the purpose of the invention, as embodied and broadly described herein, the invention comprises an apparatus for attaching conductive materials to conductive pads on a substrate, comprising: a plate having pockets located to align respectively with the conductive pads on the substrate, so that when the conductive materials are placed into the pockets and the substrate is placed onto the plate, the conductive materials contact the conductive pads on the substrate. Preferably, the pockets extend partially through the substrate.

In another preferred embodiment, there is provided an apparatus for attaching conductive materials to conductive pads on a substrate, comprising: a plate having pockets arranged in a pattern so that one group of the pockets align respectively with the conductive pads of one substrate, and so that at least one other group of the pockets align respectively with the conductive pads of at least one other substrate having conductive pad locations different than conductive pad locations on the one substrate.

In another preferred embodiment, there is provided an apparatus for attaching conductive materials to conductive pads on one side of a semiconductor substrate having other conductive pads on another side thereof, and for attaching a semiconductor chip to the other side of the semiconductor substrate, the semiconductor chip having solder bumps on one side to complement and connect with the other conductive pads on the other side of the semiconductor substrate, the apparatus comprising: a pallet having pockets to receive the conductive materials; a pick-and-place mechanism for aligning and placing the semiconductor substrate onto the pallet so that at least a portion of the pockets on the pallet are aligned respectively with the conductive pads on the one side of the semiconductor substrate, and for aligning and placing the semiconductor chip onto the semiconductor substrate so that the solder bumps on the one side of the semiconductor chip are aligned respectively with the other conductive pads on the other side of the semiconductor substrate; and a heating device for simultaneously heating the pallet, conductive materials, semiconductor substrate, and semiconductor chip so that the conductive materials attach permanently to the conductive pads on the one side of the semiconductor substrate and the semiconductor chip attaches permanently to the other side of the semiconductor substrate.

In another preferred embodiment, there is provided a method of attaching conductive materials to conductive pads presented at a generally flat substrate, comprising the steps of: providing a plate having a plurality of pockets arranged so that one of the pockets corresponds in location to each of the conductive pads; placing the conductive materials into selected pockets; and placing the substrate onto the plate so that the conductive materials contact and attach to the conductive pads on the substrate.

In another preferred embodiment, there is provided a method for attaching conductive materials to conductive pads on one side of a semiconductor substrate having other conductive pads on another side thereof, and for attaching a semiconductor chip to the other side of the semiconductor substrate, the semiconductor chip having solder bumps on one side to complement and connect with the terminals on the other side of the semiconductor substrate, the method comprising the steps of: providing a plate having pockets; placing the conductive materials into selected pockets; placing the substrate onto the plate so that the conductive pads on the one side of the substrate are aligned respectively with the selected pockets on the plate; placing the semiconductor chip onto the substrate so that the other conductive pads on the other side of the substrate are aligned respectively with solder bumps on the semiconductor chip; and simultaneously heating the plate, conductive materials, substrate, and semiconductor chip so that the conductive materials attach permanently to the conductive pads on the one side of the substrate and the semiconductor chip attaches permanently to the other side of the substrate. Preferably, the conductive materials may comprise solder paste, solder balls pre-mixed in flux, solder balls coated with tacky flux, or solder balls coated with liquid flux.

In a further embodiment, there is provided the step of placing onto the plate a stencil having holes that register with the selected pockets on the plate and with conductive pads on the substrate; and spreading the conductive materials across the stencil so that the conductive materials moves through the holes of the stencil into the selected pockets of the plate.

In other embodiments, there are provided the steps of removing the combined conductive materials, substrate, and semiconductor chip from the plate; applying a non-conductive bonding-material substance between the substrate and the semiconductor chip; cleaning the combined conductive materials, substrate, semiconductor chip and non-conductive bonding-material substance; and/or applying a non-conductive bonding abrasive-resistant material over the combined conductive materials, substrate, semiconductor chip and non-conductive bonding-material substance.

In another preferred embodiment, there is provided an apparatus for attaching conductive materials to conductive pads on a substrate, comprising: a plate having pockets, at least some of the pockets being located to align respectively with the conductive pads on the substrate so that when the conductive materials are placed into the at least some of the pockets and the substrate is placed onto the plate, the conductive materials contact and attach to the conductive pads on the substrate.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

FIG. 12a is a side view of a pallet or plate, wherein the pockets are filled with conductive materials such as solder balls.

FIG. 12b is a side view of the pallet or plate of FIG. 12a, wherein the pockets are further filled with tacky flux.

FIG. 13a is a side view of a pallet or plate, wherein the pockets are filled with conductive materials such as solder balls.

FIG. 13b is a side view of the pallet or plate of FIG. 13a, wherein the pockets are further filled with liquid flux.

FIG. 21 is a side view of a pallet with passageways for applying vacuum force to the conductive materials in the pockets.

FIG. 22 is a side view of the pallet of FIG. 21, wherein the conductive materials are further coated with flux.

DETAILED DESCRIPTION

Figure 1A:
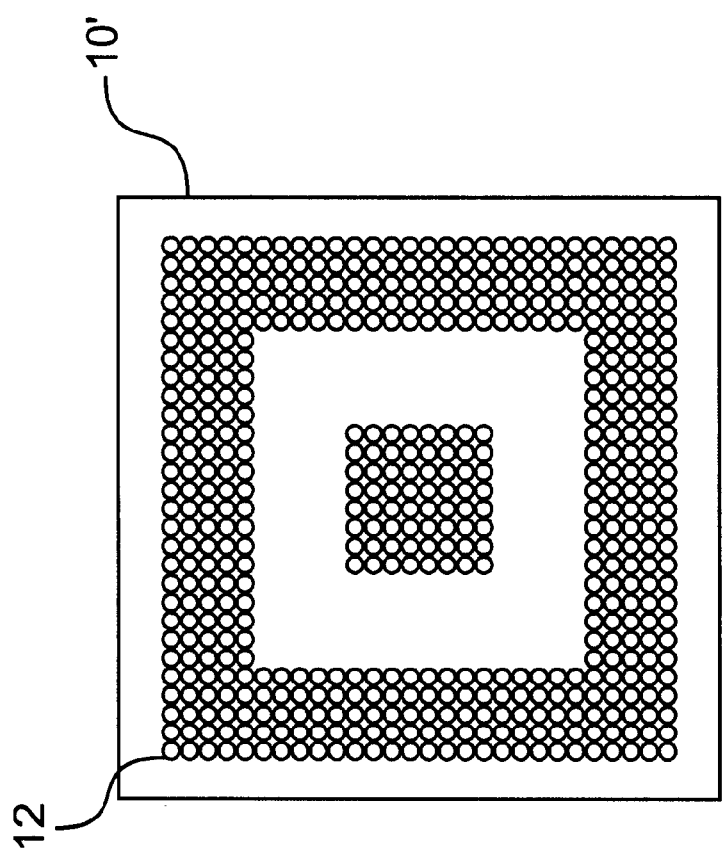
FIG. 1a is a top view of a single package pallet of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
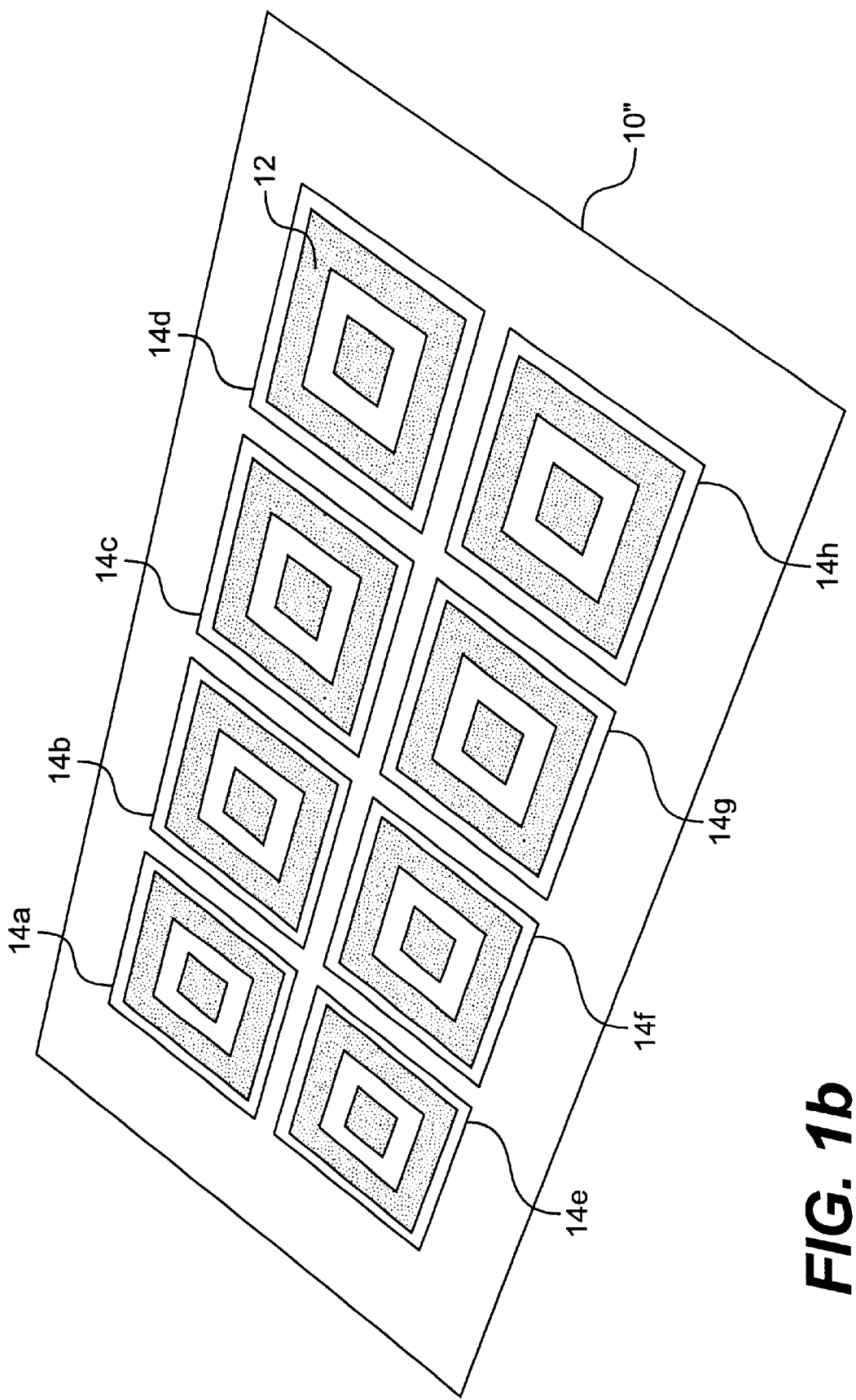
FIG. 1b is a perspective view of a multi-package pallet of the present invention.
Figure 1C:
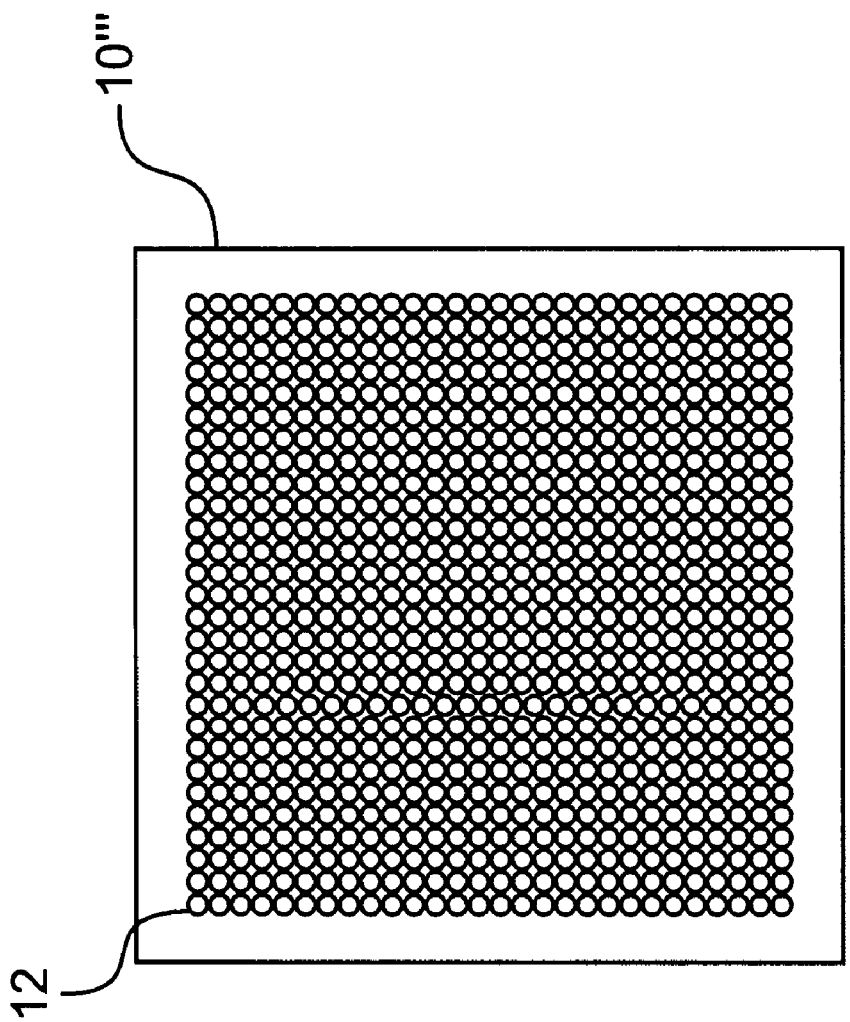
FIG. 1c is a top view of a full array pallet of the present invention.

In accordance with the present invention, there is provided a plate or pallet, generally identified by reference numeral 10, having pockets 12. Preferably, the pallets may be designed as full array pallets 10''', as shown in FIG. 1c, and different solder bump formations may be applied using different stencil screens. This enables one pallet design to be used with any package that requires a given component pitch and bump size. Alternatively, as embodied herein and shown generally in FIG. 1a, a single-chip pallet 10' includes an arrangement of pockets 12 dedicated to receive conductive material to be applied to a semiconductor substrate having conductive pads arranged in a certain pattern (not shown in FIG. 1a). The number and arrangement of pockets 12 depends upon the functional characteristics of the chip and, therefore, may vary from chip to chip. In accordance with the present invention, a multiple-chip pallet 10'' may be desirable, as shown in FIG. 1b, to facilitate mass production of chip packages.

As embodied herein, pallets 10', 10'', 10''' are preferably fabricated from any of a number of nonconductive, non-wettable-to-solder materials, such as ceramic, graphite, composite fiberglass, or silicon. These materials preferably have a low thermal mass and a thermal expansion rate matched to the other components of the semiconductor package. The pockets of the pallets 10', 10'', 10''' can be designed to form any of a number of different shapes and dimensions. The pockets are preferably so-called blind pockets, i.e., pockets that extend partially through the thickness of the pallets 10', 10'', 10''' rather than all the way through. The pockets can also be shallow or deep to allow the eventually formed solder bumps to touch the bottom of the pockets or not touch the bottom of the pockets, respectively. Where shallow pockets are used, the bottoms of the solder bumps formed by a given aperture shape may be constructed with improved bump coplanarity.

Figure 2:
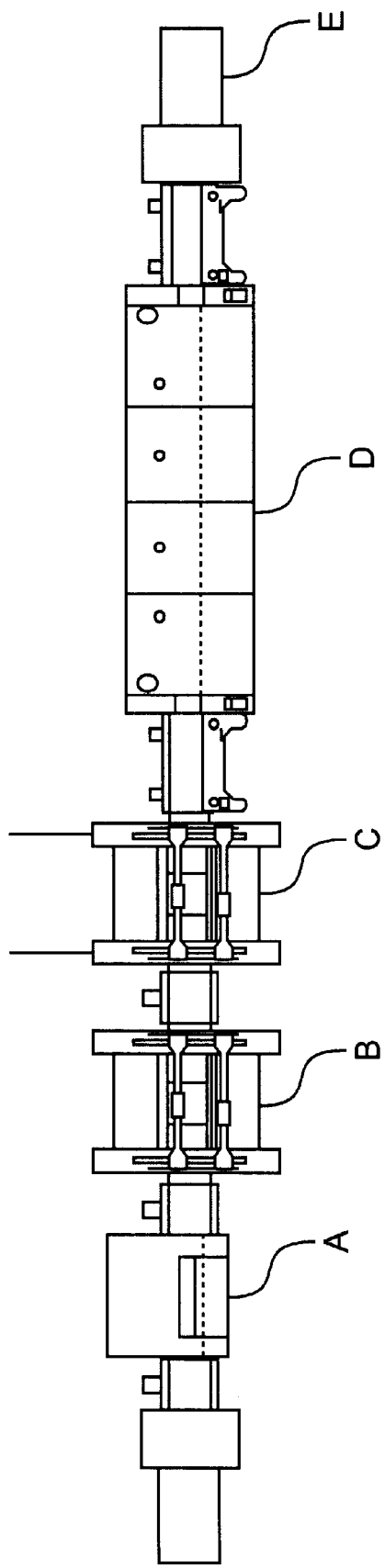
FIG. 2 is a representation of a production line for manufacturing semiconductor chips in accordance with the present invention.

In accordance with the present invention, pallets 10', 10'', 10''' are used in a semiconductor package assembly line. As embodied herein and shown in FIG. 2, the pallets 10', 10'', 10''' are conveyed to a screen printer machine A, in which solder is applied to the pockets of the pallets 10', 10'', 10'''. In accordance with the present invention, solder can be applied in at least four different methods. The first method involves applying a solder paste to the pockets of the pallets 10', 10'', 10'''. The solder paste comprises a flux binder in which microscopic solder balls are suspended. When the solder paste is eventually heated, the microscopic solder balls coalesce and form larger full-sized solder balls that are attached to conductive pads on the underside of a surface or substrate. The volatile parts of the flux evaporate while the solid residue of the flux coalesces around the larger full-sized solder balls. Typically used solder paste that is known in the art includes the Alphametals WS609 and Indium SMQ69 solder pastes.

The second method involves placing pre-formed full-sized solder balls that are pre-mixed with flux into the pockets of the pallets 10', 10'', 10'''. Typically used flux that is known in the art include the Kester TF 6522 and Indium SMQ71 fluxes. During heating, the volatile parts of the flux evaporate while the solder balls attach to the conductive pads on the underside of the substrate, and the solid residue of the flux coalesces around the solder balls.

The third method involves placing pre-formed full-sized non-fluxed solder balls into the pockets of the pallets 10', 10'', 10''' and subsequently coating the dry solder balls with tacky flux. The fourth method involves placing pre-formed full-sized dry solder balls into the pockets of the pallets 10', 10'', 10''' and subsequently coating the dry solder balls with liquid flux. In both the third and fourth methods, upon heating, the volatile parts of the flux evaporate while the solder balls attach to the conductive pads on the underside of the substrate. These four different methods are further illustrated in FIGS. 3b and 11–13b and described in more detail below.

After the solder, in the form of solder paste, pre-mixed solder balls, or coated solder balls, is applied to the pockets of the pallets 10', 10'', 10''', the pallets 10', 10'', 10''' are conveyed to a pick-and-place machine B, in which the substrate is picked up and placed on the pallet. The pick-and-place machine B reads locating features, such as fiducial marks, or empty or full pockets, on the pallets 10', 10'', 10''' to properly align the substrate on the pallets 10', 10'', 10'''. The alignment process is sometimes referred to as a vision alignment process and is computer controlled to allow for extremely accurate alignment. When the multi-chip pallet 10'' is used, the pick-and-place machine B repeats the above steps several times until each arrangement of pockets 14a–14h is covered with a substrate. Since the substrate is placed on the pallets 10', 10", 10'" after the solder has already been placed in the pockets, solder paste inspection or optical inspection of ball presence can be performed before the placement of the substrate.

Figure 1D:
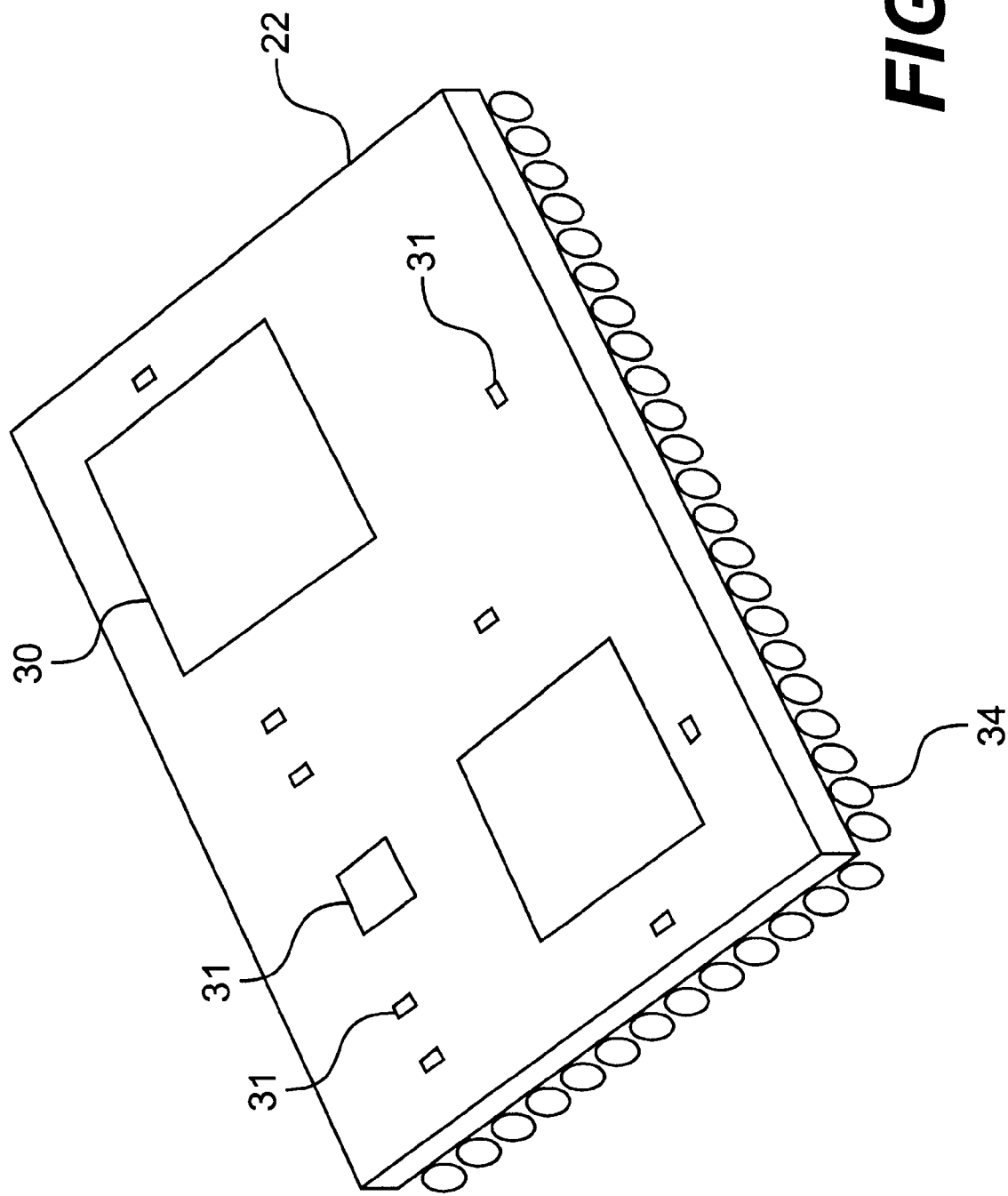

The pallets 10', 10", 10'" are then conveyed to a second pick-and-place machine C, in which, as described later in this application, a semiconductor chip or die is picked up and placed on the substrate. The second pick-and-place machine C reads locating features on the substrate to properly place the die. It should be recognized that, alternatively, the first pick-and-place machine B can be used to place both the substrate on the pallet and the die on the substrate. In such an embodiment, the second pick-and-place machine C would not be used. It should also be recognized that in accordance with the present invention, either of the pick-and-place machines B, C can be used to place multiple dies on a single substrate 22, or different combinations of dies 30 and other components 31, such as resistors, capacitors, or heat sinks, as illustrated in FIG. 1d.

Where a single die is placed on the substrate, after the die has been placed, the pallet, substrate, and die are then conveyed to a reflow heating oven D, in which they are heated, and the electrical connections with the solder become permanent. A typically used reflow oven known in the art is the Vitronics Soltec Magnatherm 730N oven.

After the heating step is completed, formation of the semiconductor packages is substantially completed and the packages, consisting of the connected solder, substrate, and die, optionally may be removed from the pallets 10', 10", 10'", after which the pallet can be cleaned as needed and reused. Meanwhile, the completed package is conveyed onto a platform E, where it can be taken to be underfilled with an appropriate nonconductive bonding material, such as an epoxy, and/or cleaned. The underfilled layer serves to protect the package from environmental contaminants and keep the components of the package fastened together. In addition, an optional final over-coating of a nonconductive bonding abrasive-resistant material can be applied to the package. Such an over-coating is typically referred to as a glob-top coating. It should be recognized that, in accordance with the present invention, the package can be neither underfilled nor over-coated, only underfilled, only over-coated, or both underfilled and overcoated, depending on the needs of the application. The above described features and steps are described in greater detail below.

Figure 3A:
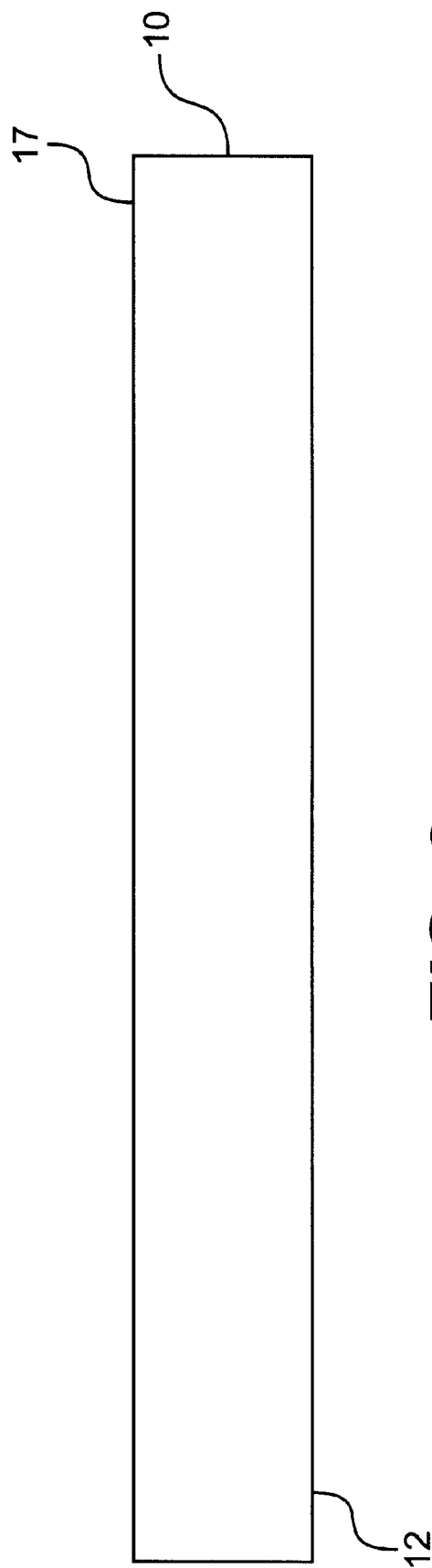
FIG. 3a is a side view of a pallet or a plate having pockets that are located to align respectively with the conductive pads on a substrate or a surface.
Figure 3B:
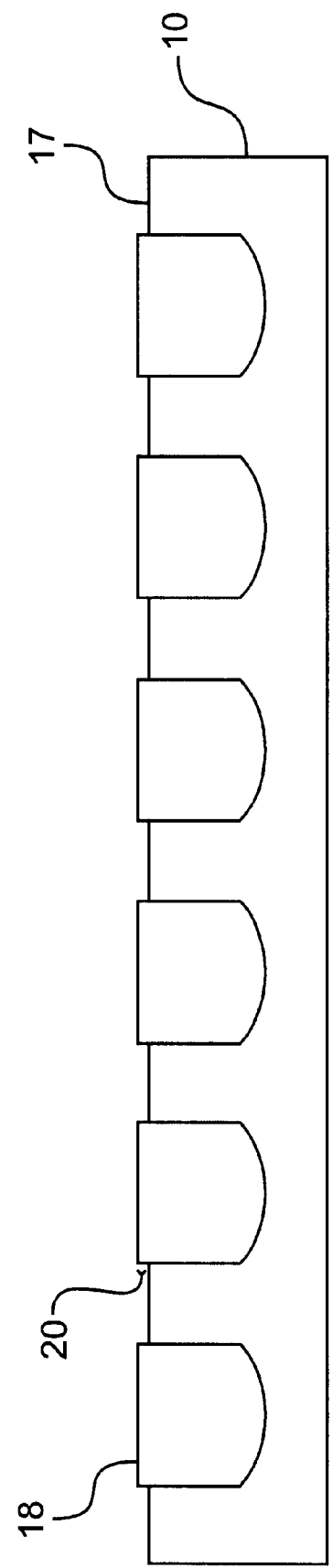
FIG. 3b is a side view of the pallet or plate of FIG. 3a, wherein the pockets are filled with conductive materials such as solder paste.

As stated above, one embodiment of the present invention involves the use of solder paste to fill the pockets of the pallets 10', 10", 10'". In that embodiment, pallets 10', 10", 10'" are positioned within a screen printer A, at which time solder paste is applied to the pallets 10', 10", 10'". As shown in FIGS. 3a and 3b, the pockets 12 on the pallet 10 are located to align respectively with the conductive pads on a substrate. The pockets 12 extend partially through the thickness of the pallet 10 and are initially empty. Similarly, the screen printer A includes a metal plate or stencil 16 having holes 16a, each of which is aligned with one of the pockets 12 on the pallets 10', 10", 10'". Each of the pads of the substrate is in turn aligned with one of the holes 16a of the stencil 16. Locating features, alternatively referred to as "alignment indicators," such as empty or full pockets or fiducial marks 17 are identified by a suitable detection apparatus, as generally known in the art, to properly align the plate or pallet and the stencil. The alignment process is sometimes referred to as a vision alignment process and is computer controlled to allow for extremely accurate alignment. Once aligned, the pallets 10', 10", 10'" are raised so that the pockets 12 are immediately beneath the holes 16a. The solder paste 18 is then applied to the stencil 16 so that conductive material passes through the holes 16a and into the pockets 12 on the pallets 10', 10", 10'".

Figure 3C:
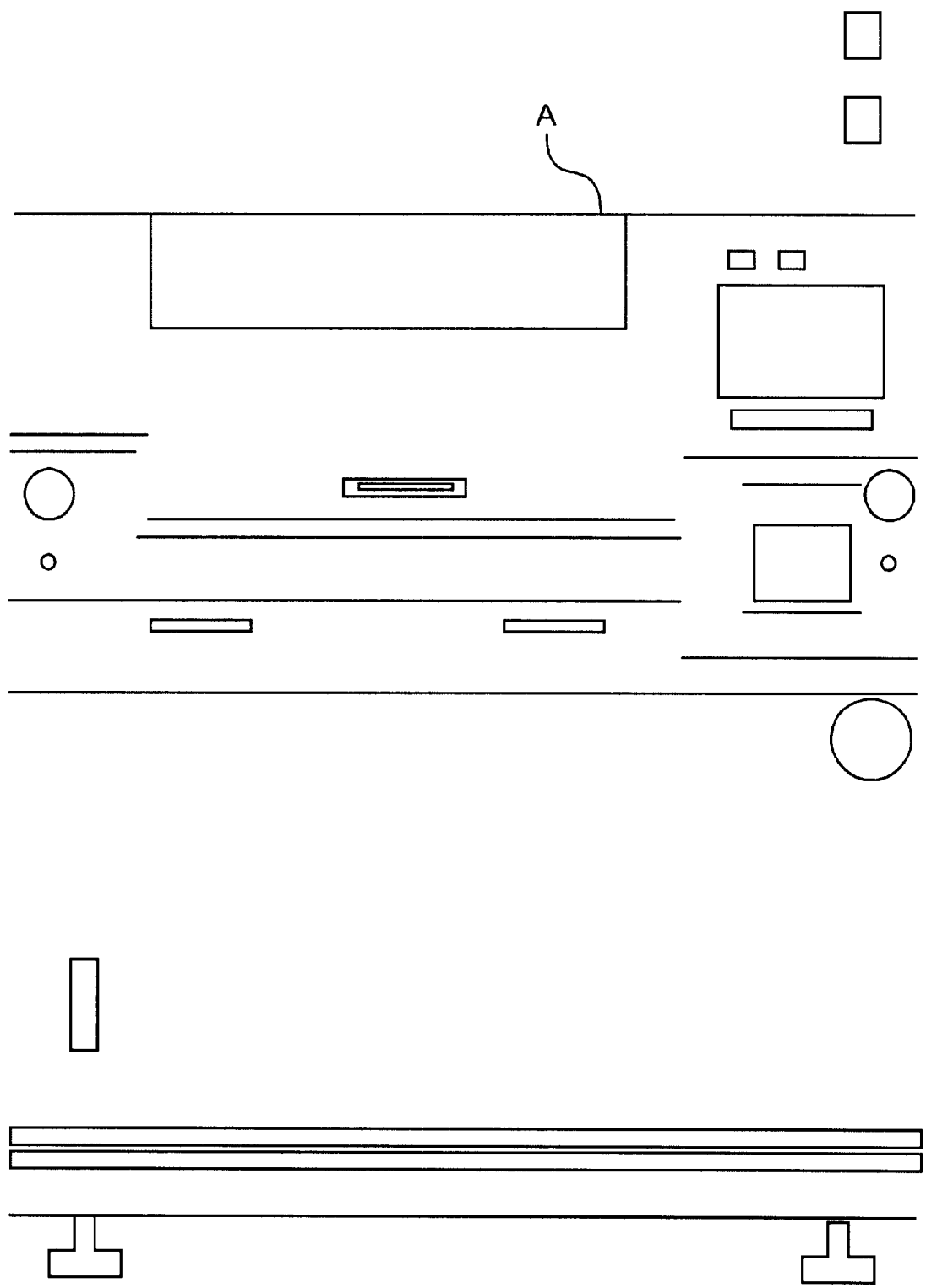
FIG. 3c is a side view of a screen printing machine.
Figure 3D:
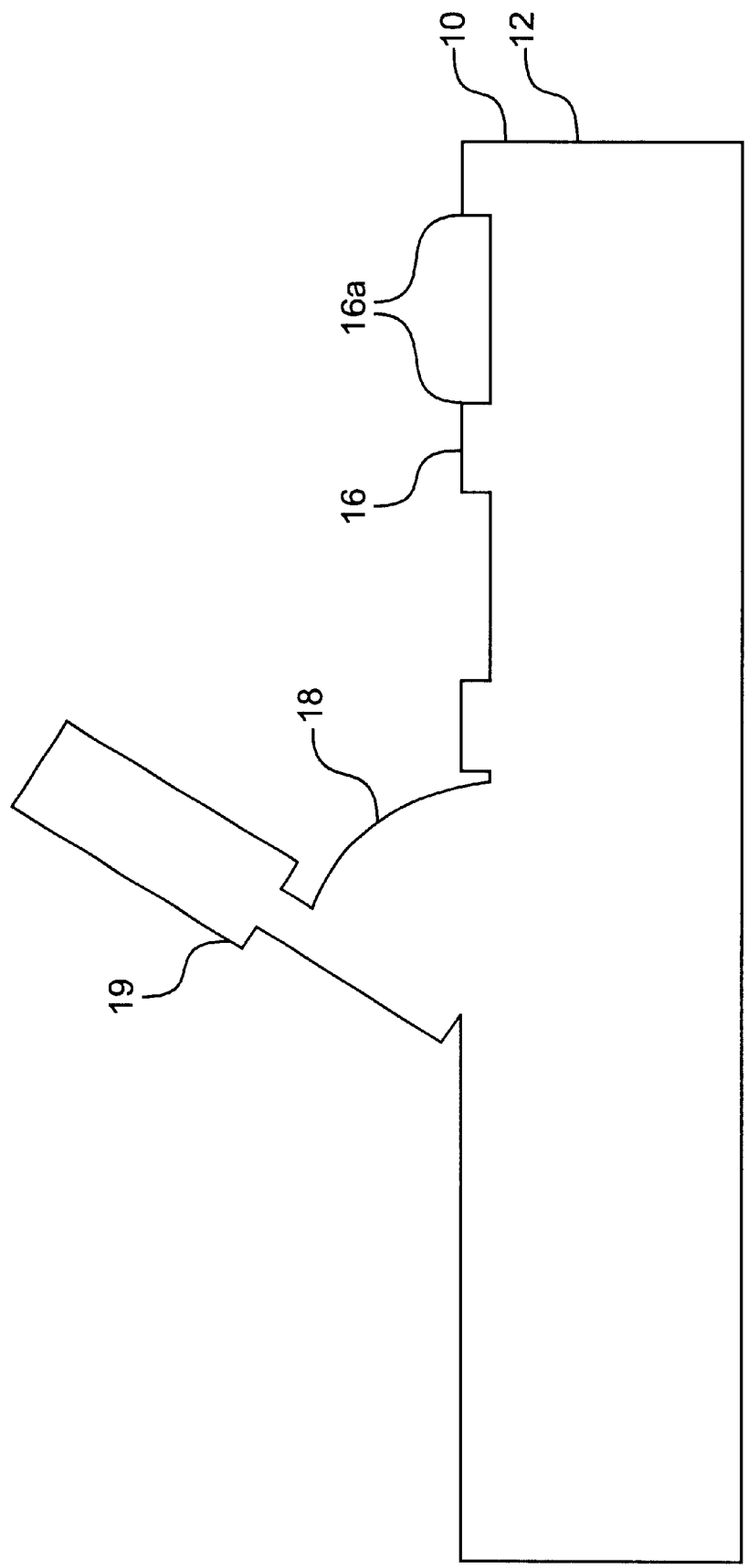
FIG. 3d is a side view of a portion of a screen printing machine printing solder paste into the pockets of a pallet.

When solder paste 18 is used, it is preferably applied through a technique called stencil printing, as shown in FIGS. 3c and 3d. In such a technique, the solder paste is spread over the stencil 16 by a machine, such as a DEK brand screen printer machine having a ProFlow™ print head, or a machine that uses a spreading apparatus 16c, such as a squeegee, and the solder paste flows through the holes in the stencil 16 and fills the corresponding pockets 12. This technique causes the solder paste to protrude over the top opening of the pockets 12. As shown in FIG. 3d, the solder paste 18 will protrude a distance 20 equal to the thickness of the particular metal mask or stencil that is used in the technique. Typically, stencil thickness is in the range of 2.0 to 5.0 mils. In accordance with the present invention, the printing process may be fully automated.

The stencil 16 may be used to vary the number or arrangement of solder bumps that are attached to a substrate surface. For example, the stencil 16 may include holes 16a, which differ in arrangement or quantity from the arrangement of pockets 12 on the pallets 10', 10", 10'" depicted in FIGS. 1a or 1b. When solder paste 18 is used and it is spread over the stencil 16, only the pockets 12 on the pallets 10', 10", 10'" that have corresponding stencil holes 16a will be filled with solder paste 18. As described in further detail below, the printing process may also be used in embodiments that involve the use of pre-formed solder balls, rather than solder paste.

Figure 4:
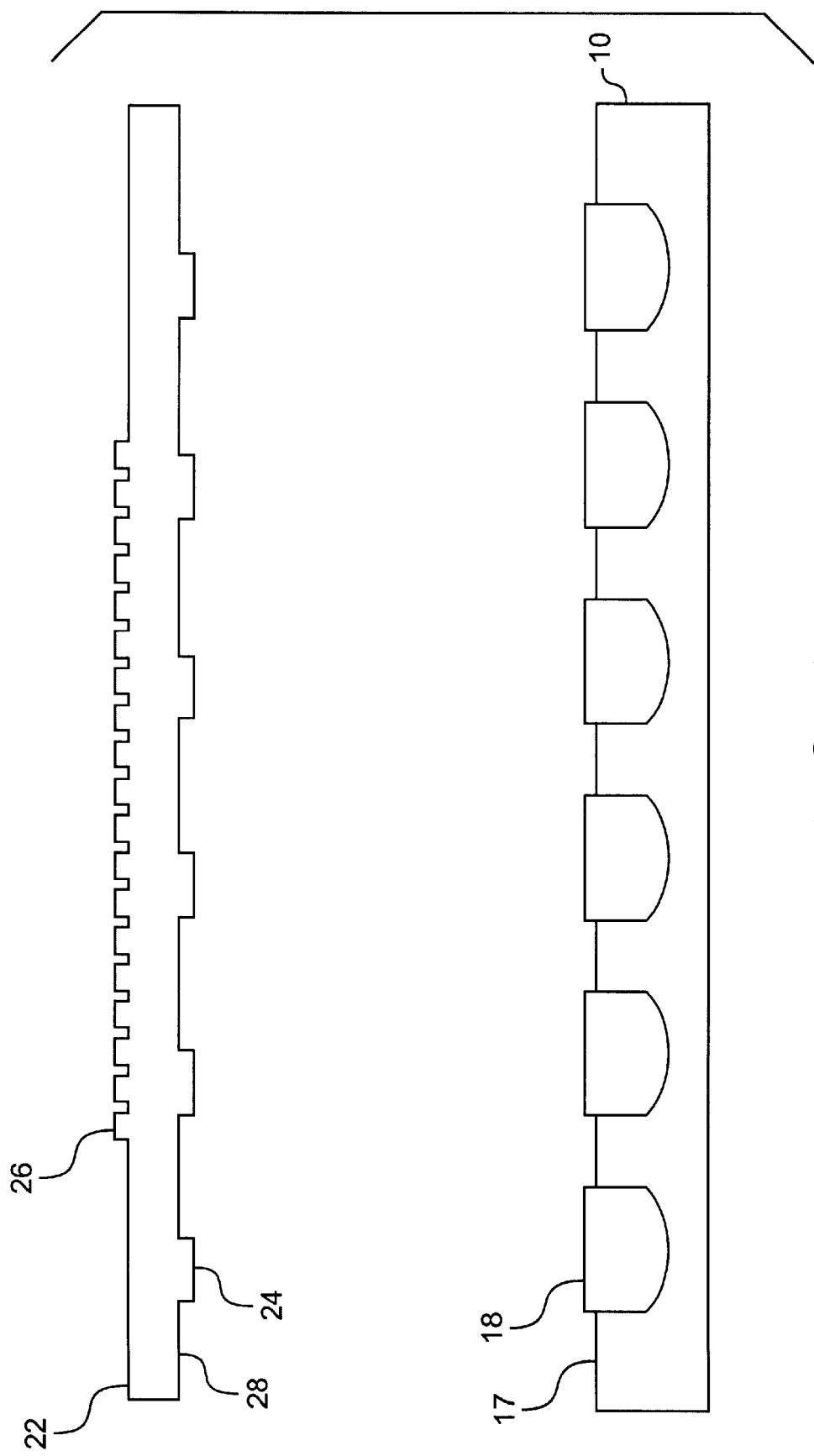
FIG. 4 is a side view of a substrate or surface positioned above a pallet or plate so that the conductive pads on the underside of the substrate or surface are aligned with the pockets of conductive materials, such as solder paste, on the pallet or plate.

In accordance with the present invention, if solder paste 18 is used, after the pallets 10', 10", 10'" are conveyed to the first pick and place machine B, the substrate 22 is positioned above the pallets 10', 10", 10'", as shown in FIG. 4, before the substrate 22 is placed onto the pallets 10', 10", 10'". The substrate has conductive pads 24 on its underside. These conductive pads are sometimes called substrate-attachment pads and are located to align with certain of the pockets 12 in the pallets 10', 10", 10'". Thus, when the substrate 22 is placed onto the pallets 10', 10", 10'", the substrate-attachment pads 24 contact the solder 18 protruding from the top opening of certain of the pockets 12. When the apparatus is eventually heated, the solder balls formed from the solder paste 18 and the substrate-attachment pads 24 form a permanent electrical and mechanical connection.

The substrate 22 also has conductive pads 26 located on its top side. These conductive pads 26 are aligned with pre-formed solder bumps on the underside of a die or semiconductor chip. The substrate preferably also has locating features, alternatively referred to as "alignment indicators," such as fiducial marks or designated pads that eventually will be used to align a die with the substrate.

In accordance with the present invention, in the embodiment in which solder paste 18 is used, the semiconductor substrate 22 of FIG. 4 is placed upon the pallet 10 of FIG. 4. The substrate 22 and pallet 10 are aligned by the locating features such as fiducial marks 17 or designated pads so that the substrate-attachment pads 24 contact the solder 18 that protrudes from the pockets 12. The substrate has conductive pads 26 located on its top side. The substrate(s) is typically placed upon the pallet 10 by the first pick-and-place machine B. Such a machine reads the locating features such as fiducial marks 17 or designated pads, picks up the substrate 22, aligns it using the locating features such as fiducial marks 17 or designated pads, and then places the substrate 22 in the proper location on the pallet 10. The alignment process is sometimes referred to as a vision alignment process and is computer controlled to allow for extremely accurate alignment. A preferred pick-and-place machine for performing these functions is a GSM brand pick-and-place system, available from Universal Corp. of Binghamton, N.Y.

Figure 5:
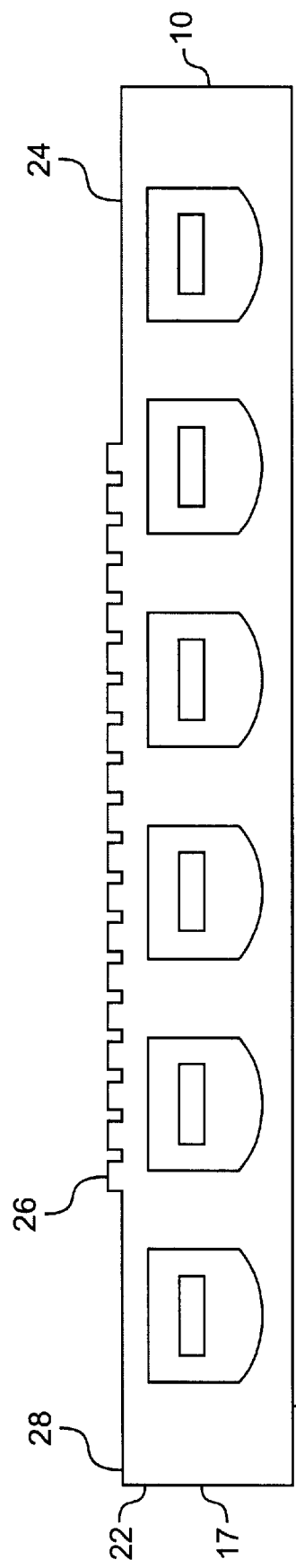
FIG. 5 is a side view of the substrate or surface of FIG. 4 placed upon the pallet or plate of FIG. 4 so that the conductive pads on the underside of the substrate or surface are aligned with the pockets of conductive materials, such as solder paste, on the pallet or plate.
Figure 6:
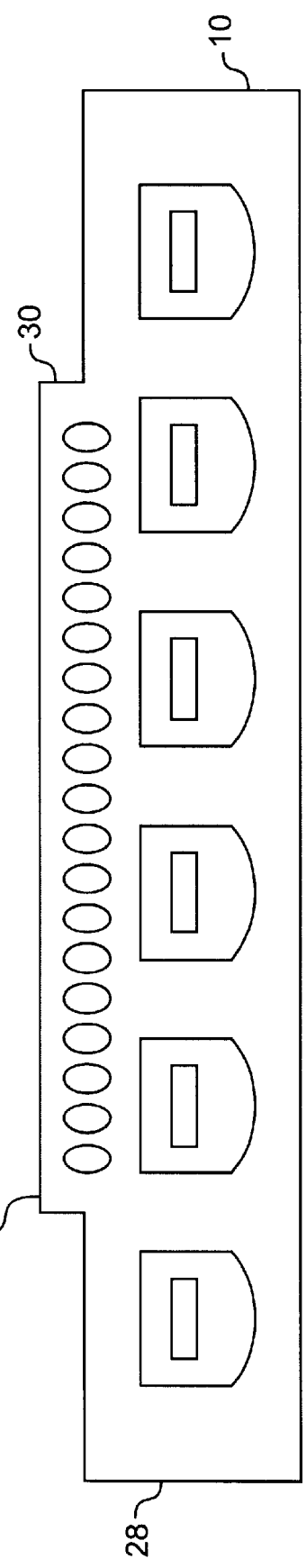
FIG. 6 is a side view of a die or semiconductor chip placed upon the substrate or surface of FIG. 5 so that the conductive pads on the underside of the die or semiconductor chip are aligned with the conductive pads on the top side of the substrate or plate.

In accordance with the present invention, a die or semiconductor chip 30 is placed upon the substrate or surface of FIG. 5 preferably by a second pick-and-place machine C. This is shown in FIG. 6. The second pick-and-place machine is also preferably a GSM brand pick-and-place system. The die 30 has solder bumps 32 that are aligned with and contact the conductive pads 26. The die 30 is typically placed upon the substrate by a pick-and-place machine C. The pick-and-place, machine C reads the substrate's locating features such as fiducial marks 28 or designated pads, picks up the die 30, reads the die's locating features such as designated solder bumps, and aligns it with the substrate 22 so that the solder bumps on the die 30 are aligned with the conductive pads 26 of the substrate 22. While a second pick-and place machine is preferred, these tasks can be performed by the same machine as the one used to place the substrate 22 upon the pallets 10', 10", 10'". The die 30 preferably is dipped in flux before being placed upon the substrate. Flux may also be applied, to the substrate or die (but typically not both) however, by spraying, atomizing, positive-displacement dispensing, or brushing. These flux-application techniques are generally known in the art.

Figure 7:
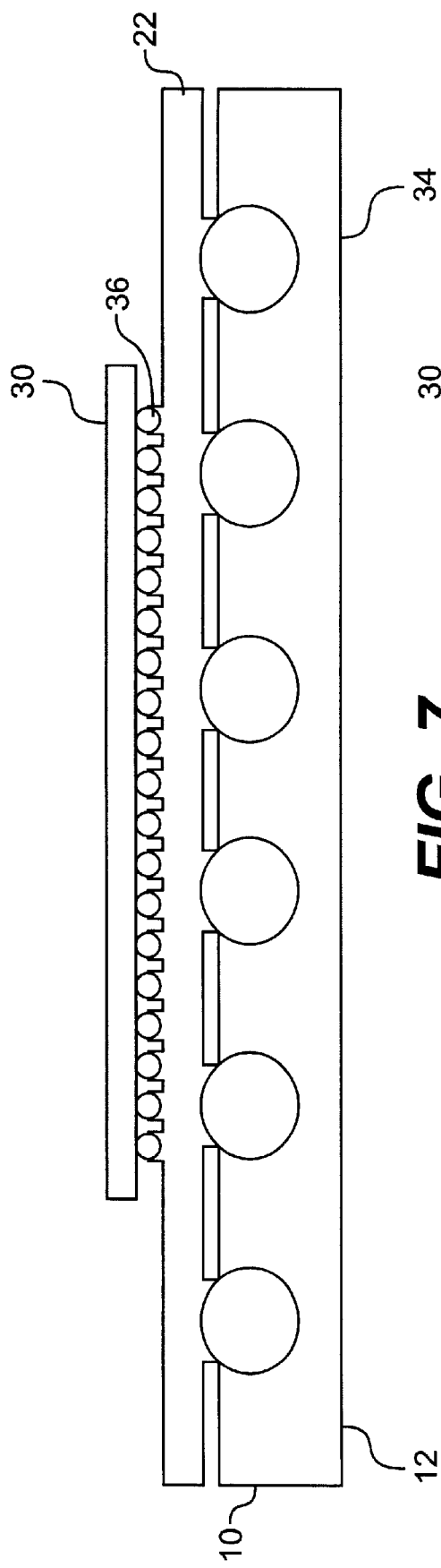
FIG. 7 is a side view of the semiconductor-chip package on a pallet or plate, of FIG. 6, after it has been reflowed or passed through a heating oven.

In accordance with the present invention, in the embodiment in which solder paste 18 is used, once the die 30 is positioned on the substrate, the pallets 10', 10", 10'" are passed to the reflow heating oven D. As explained above, during the reflowing process, microscopic solder balls that are suspended in the solder paste coalesce to form a larger spherical package bump 34 that are attached to the substrate-attachment pads 24, as shown in FIG. 7. During the same reflowing process, the pre-formed solder bumps 32 on the underside of the die 30 and the conductive pads 26 also combine to form solder joints 36 between the die and the substrate.

Figure 8:
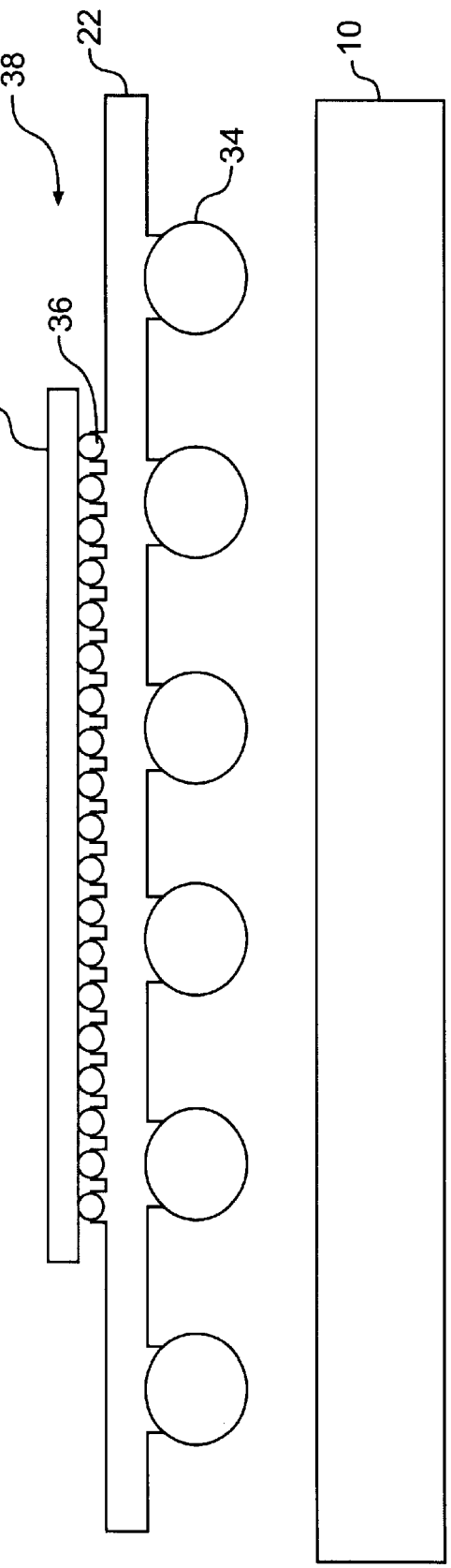
FIG. 8 is a side view of the semiconductor-chip package of FIG. 7 that has been removed from the pallet or plate of FIG. 7, after it has been reflowed or passed through a heating oven.
Figure 9:
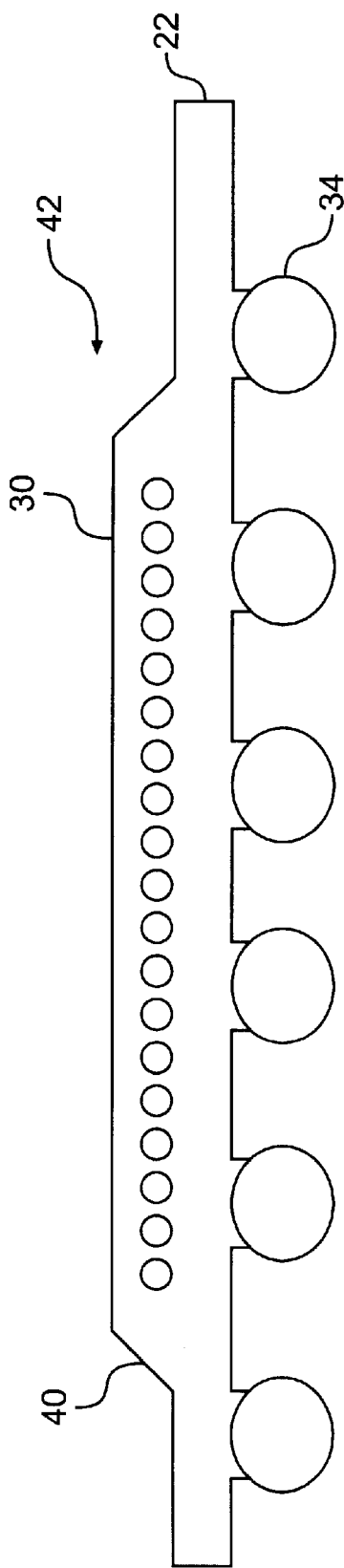
FIG. 9 is a side view of the semiconductor-chip package of FIG. 8, in which an adhesive substance has filled the space between the die or semiconductor chip and the substrate or surface.
Figure 10:
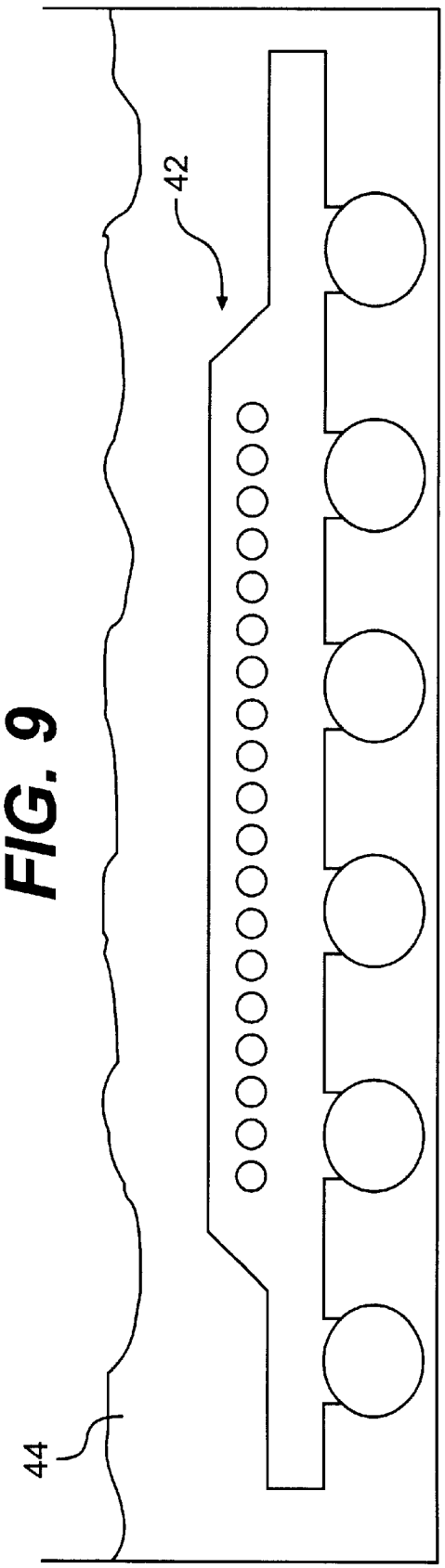
FIG. 10 is a side view of the semiconductor-chip package of FIG. 9 being cleaned in a solvent such as de-ionized water.

In accordance with the present invention, and as shown in FIG. 8, in the embodiment in which solder paste 18 has been used, the combined die 30, substrate 22, and package bumps 34 may be lifted from the pallet 10 or left in. This pre-underfilled semiconductor-chip package 38 is functional, electrically. In other words, in this form, the die 30 is capable of functioning, mechanically and electrically, in the electrical or electronic product in which it is to be used. The chip package can be underfilled, as shown in FIG. 9, however, to make it more durable. Typical underfilling materials known in the art include Dexter Hysol 4511 and Namics U8437-2 underfilling materials. FIG. 9 shows the combined die 30, substrate 22, and package bumps 34, with the addition of a non-conductive bonding material 40, typically referred to as underfill, filling the gaps between the die 30 and the substrate 22. At this point, the semiconductor-chip package 42 is complete and can be cleaned in solvent 44, such as de-ionized water, as shown in FIG. 10. As noted above, an optional final over-coating can be applied to the package. Such an over-coating is typically referred to as a glob-top coating and typically is a non-conductive, bonding, abrasion-resistant material. Some typically used glob-top materials include the Loctite 3534; the Ablestick 759H, 7950, and 7900; and the Dexter FP4450, FP4457, and FP4460 materials.

Figure 11:
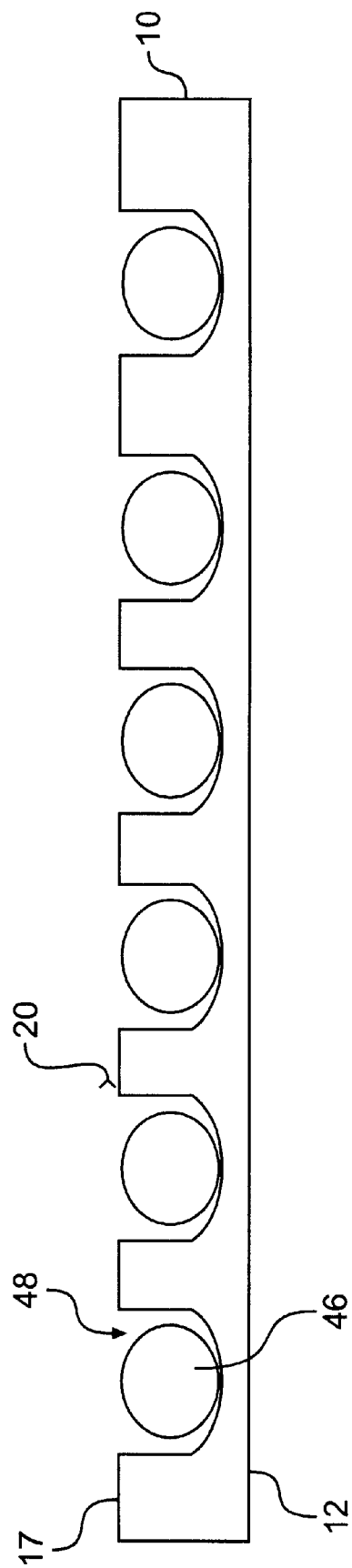
FIG. 11 is a side view of a pallet or plate, wherein the pockets are filled with conductive materials such as solder balls mixed in flux.

In accordance with a further embodiment of the present invention, pre-formed dry solder balls, rather than solder paste 18, can be used. As shown in FIG. 11, in the embodiment in which pre-formed solder balls that are pre-mixed in flux are used, there is provided a section of the pallet 10, having pockets 12 filled with a conductive mixture of preformed solder balls 46 and flux 48. In this embodiment, the solder balls 46 are pre-mixed in flux 48 and preferably applied into the pockets 12 on the pallets 10', 10", 10'" through stencil printing. Such a technique causes some of the flux 48 and the top portions of the pre-formed solder balls 46 to protrude slightly over the top opening of the pockets 12. The flux will protrude a distance 20 equal to the thickness of the particular metal mask or stencil that is used in the technique. The top portions of the solder balls 46 will protrude a distance over the top opening, depending on the diameter of the balls and the depth of the pockets. Eventually, the pockets of solder balls mixed in flux will be attached to a substrate surface, forming solder bumps.

In accordance with the present invention, there is provided a further embodiment in which dry solder balls are placed and subsequently coated with tacky flux. As shown in FIG. 12a, a part of a pallet 10 has pockets 12 that are located to align respectively with the conductive pads on a substrate or surface. The pockets are filled with dry solder balls 46. The solder balls are placed into the pockets such as by stencil printing or by any conventional technique known in the art for loading solder balls. FIG. 12b shows the plate or pallet 10 of FIG. 12a having pockets 12 filled with solder balls 46. The pockets 12 are further filled with a flux material such as tacky flux 50. The tacky flux 50 is applied over the solder balls 46 in the pockets by stencil printing.

In accordance with the present invention, there is provided a further embodiment in which dry solder balls are placed and subsequently coated with liquid flux. As shown in FIG. 13a, in the embodiment in which a pallet 10 having dedicated pockets is used, the pockets 12 are located to align respectively with the conductive pads on a substrate or surface. The pockets are filled with dry solder balls 46. The solder balls are placed into the pockets by stencil printing or by any conventional technique known in the art for loading solder balls. FIG. 13b shows the plate or pallet 10 of FIG. 13a having pockets 12 filled with solder balls 46. The pockets 12 are further filled with liquid flux 52. The liquid flux is applied over the solder balls 46 in the pockets by spraying, atomizing, positive-displacement dispensing, or brushing. The spraying, atomizing, positive-displacement dispensing, and brushing techniques are known in the art.

As apparent from the discussion above, in accordance with the present invention, there are at least three embodiments involving the use of pre-formed solder balls, namely: (1) The embodiment involving pre-formed solder balls that are pre-mixed in flux; (2) the embodiment involving the dry solder balls that are placed in the pockets and subsequently coated with tacky flux; and (3) the embodiment involving the dry solder balls that are placed in the pockets and subsequently coated with liquid flux.

In accordance with the present invention, and as illustrated in FIGS. 21 and 22, in either of the embodiments involving the use of dry pre-formed solder balls, passageways 60 or channels may be added to the pallet 10 so that vacuum force may be applied to the solder balls 46. The vacuum force is applied in order to draw the solder balls 46 into the pockets and hold the solder balls in the pockets during removal of the stencil 16 so that the balls 46 do not stick to the stencil 16 when the stencil 16 is removed. Incidentally but not vitally, the vacuum force may also hold the solder balls 46 in place during the dispensing of flux.

Figure 14:
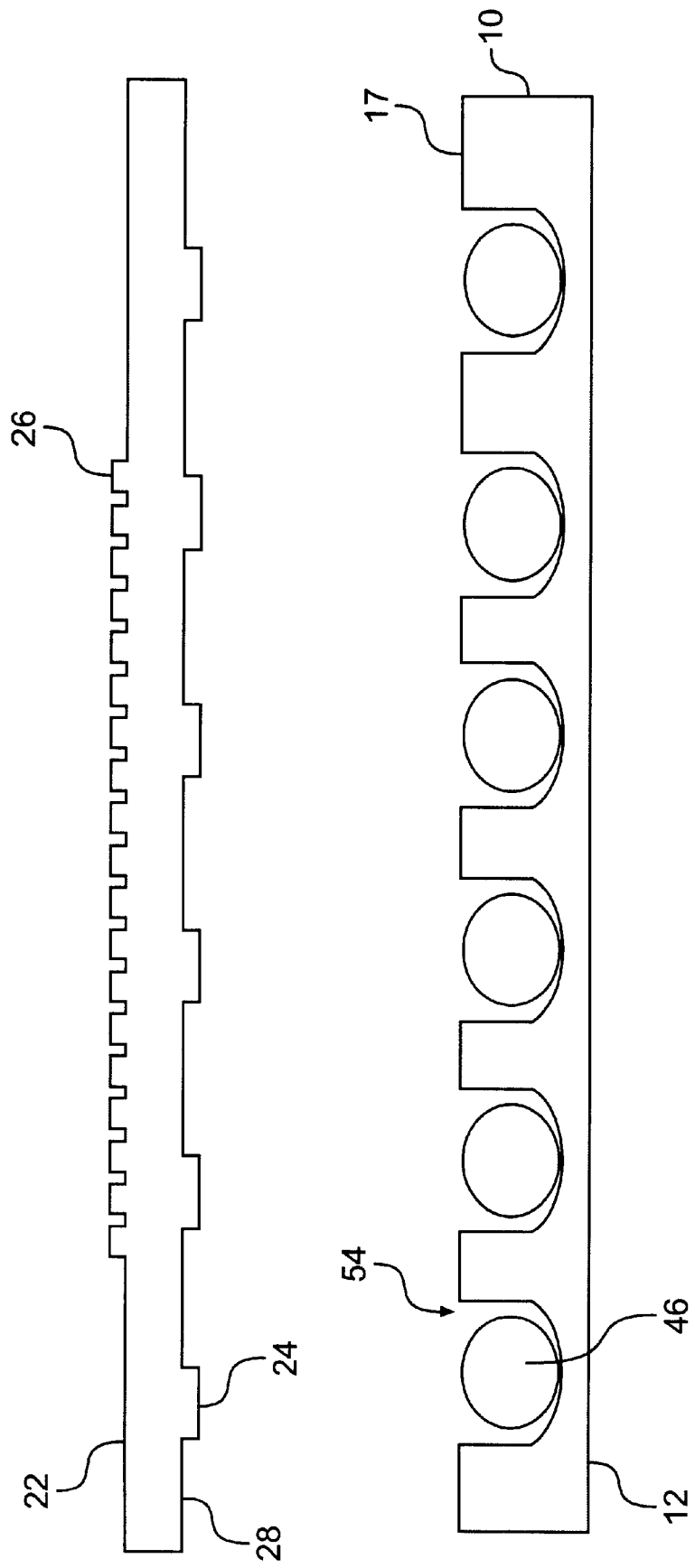
FIG. 14 is a side view of a substrate or surface positioned above a pallet or plate so that the conductive pads on the underside of the substrate or surface are aligned with the pockets of conductive materials, such as solder balls mixed with flux, on the pallet or plate.

In accordance with the present invention, in any of the three embodiments involving the use of pre-formed solder balls, a substrate or surface 22 is positioned above a pallet 10 before the substrate 22 is placed onto the pallet 10, as shown in FIG. 14. The substrate 22 has substrate-attachment pads 24 on its underside. These substrate-attachment pads 24 are located to align with the pockets 12 in the pallet 10. Thus, when the substrate 22 is placed onto the pallet 10, the substrate-attachment pads 24 contact the solder balls 46 mixed in flux material 54 protruding from the top opening of the pockets. The flux material 54 may comprise either tacky flux 50 or liquid flux 52. When the apparatus is eventually heated, the solder balls 46 mixed in flux material 54 and the substrate-attachment pads 24 form a permanent connection.

As embodied herein, the substrate also has conductive pads 26 located on its top side. These conductive pads 26 are located to align with the solder bumps on the underside of a die or semiconductor chip. The substrate also preferably has locating features such as fiducial marks 28 or designated pads that eventually will be used to align a die or semiconductor chip with the substrate.

Figure 15:
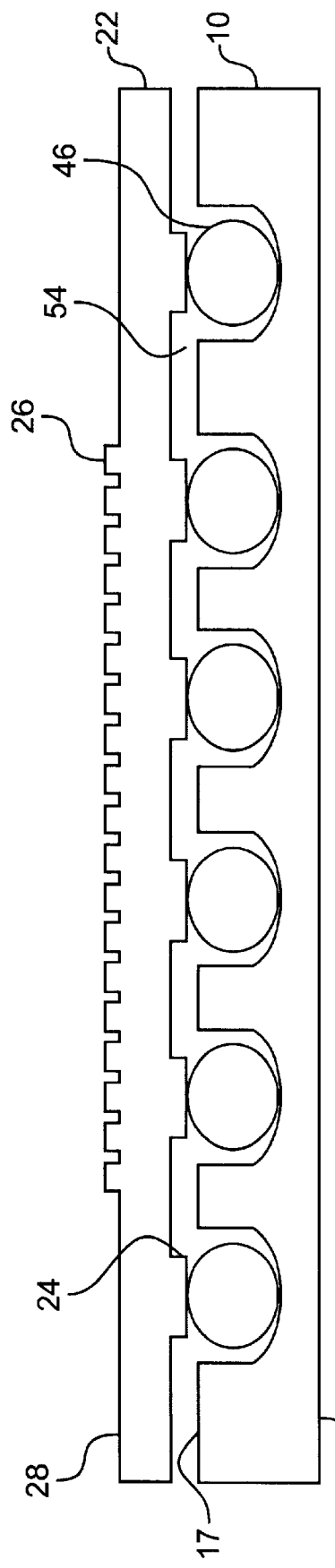
FIG. 15 is a side view of the substrate or surface of FIG. 14 placed upon the substrate or surface of FIG. 14 so that the conductive pads on the underside of the substrate or surface are aligned with the pockets of conductive materials, such as solder paste, on the pallet or plate.

Also in accordance with the present invention, and as shown in FIG. 15, in any of the three embodiments involving the use of preformed solder balls, the substrate 22 of FIG. 14 is placed upon the pallet or plate 10 of FIG. 14. The substrate 22 and pallet 10 are aligned by the locating features such as fiducial marks 17 or designated pads so that the substrate-attachment pads 24 contact the solder balls 46 mixed in flux material 54 that protrude from the pockets 12. The substrate 22 has conductive pads 26 located on its top side. The substrate is typically placed upon the pallet 10 by a pick-and-place machine. Such a machine reads the locating features such as fiducial marks 17 or designated pads, picks up the substrate 22, aligns it using the locating features such as fiducial marks 17 or designated pads, and then places the substrate in the proper location on the pallet. The alignment process is sometimes referred to as a vision alignment process.

Figure 16:
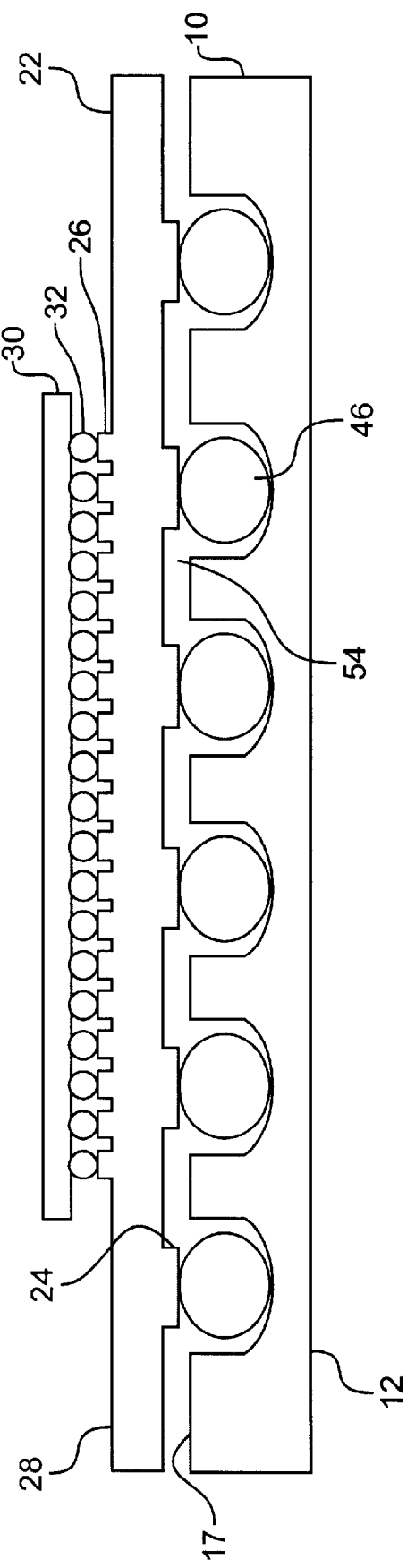
FIG. 16 is a side view of a die or semiconductor chip placed upon the substrate or surface of FIG. 15 so that the conductive pads on the underside of the die or semiconductor chip are aligned with the conductive pads on the top side of the substrate or plate.

FIG. 16 shows a die 30 placed upon the substrate or surface of FIG. 15. The die has pre-formed solder bumps 32 that are aligned with and contact the conductive pads 26. Typically, the die 30 will be dipped in flux before being placed upon the substrate 22. Flux may also be applied to the substrate or the die (but typically not both), however, by spraying, atomizing, positive-displacement dispensing, or brushing. These flux-application techniques are generally known in the art. The die 30 is typically placed upon the substrate 22 by a pick-and-place machine. Such a machine reads the substrate's locating features such as fiducial marks 28 or designated pads, picks up the die 30, reads the die's locating features such as designated solder bumps, picks up the die 30, and aligns it with the substrate 22 so that the solder bumps on the die 30 are aligned with the conductive pads 26 of the substrate 22.

Figure 17:
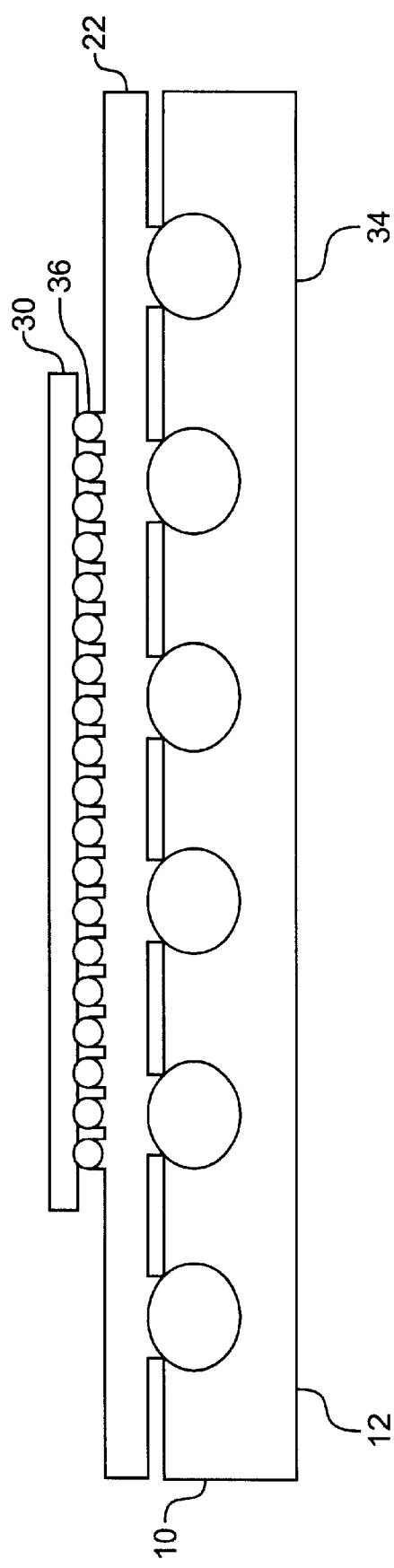
FIG. 17 is a side view of the semiconductor-chip package on a pallet or plate, of FIG. 16, after it has been reflowed or passed through a heating oven.

FIG. 17 shows the apparatus after it has been heated. The heating process typically occurs in a heating oven D and is referred to as reflowing. During the reflowing process, the solder balls 46 mixed with flux material 54 and the substrate-attachment pads 24 combine to form package bumps 34. The solder tends to shrink vertically and becomes a truncated sphere in shape. Thus, the package bumps 34 end up being a truncated sphere in shape and the substrate 22 may be lifted, to a small extent, off the surface of the pallet 10, depending on the design of the pockets and the solder volume applied (i.e., the solder bumps may be truncated at both ends). During the reflowing process, the pre-formed solder bumps 32 on the underside of the die 30 and the conductive pads 26 also combine to form solder joints 36 between the die and substrate.

Figure 18:
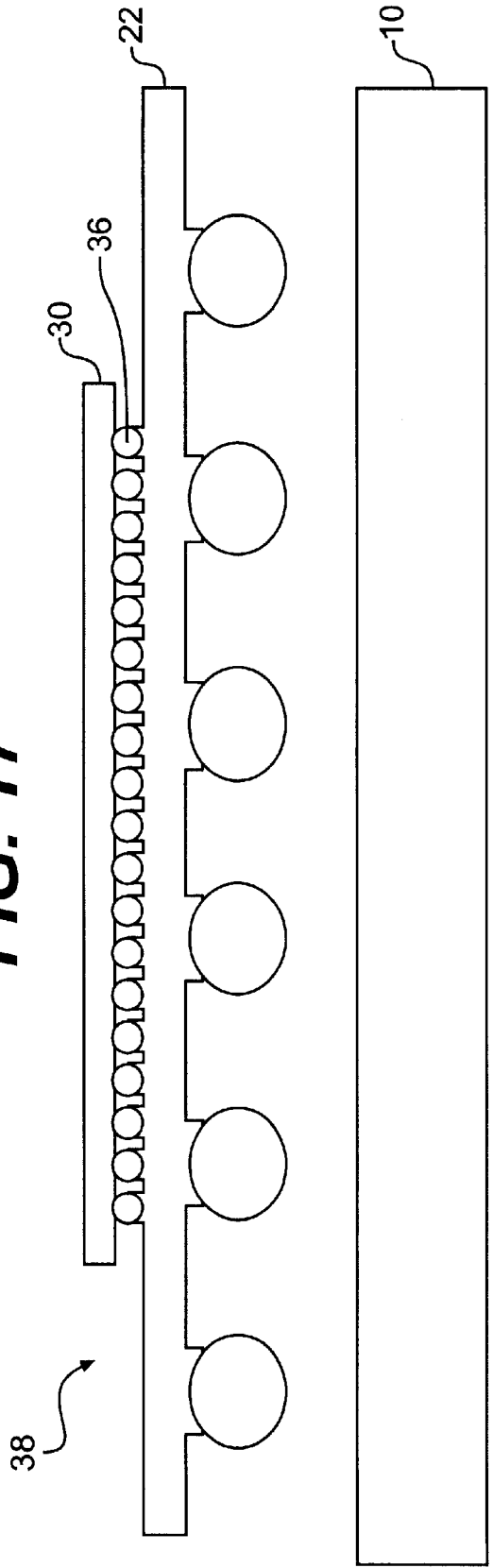
FIG. 18 is a side view of the semiconductor-chip package of FIG. 17 that has been removed from the pallet or plate of FIG. 17, after it has been reflowed or passed through a heating oven.
Figure 19:
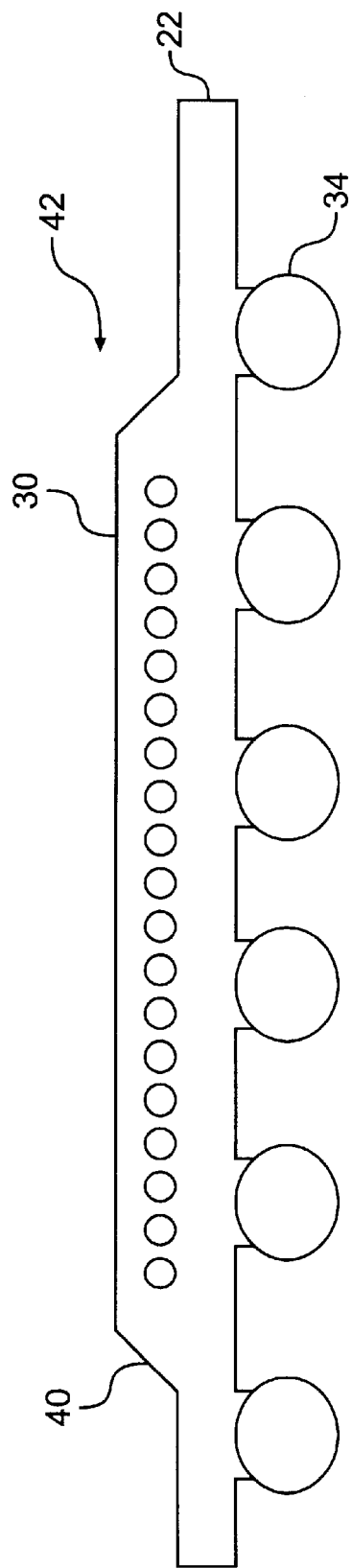
FIG. 19 is a side view of the semiconductor-chip package of FIG. 18, in which an adhesive substance has filled the space between the die or semiconductor chip and the substrate or surface.
Figure 20:
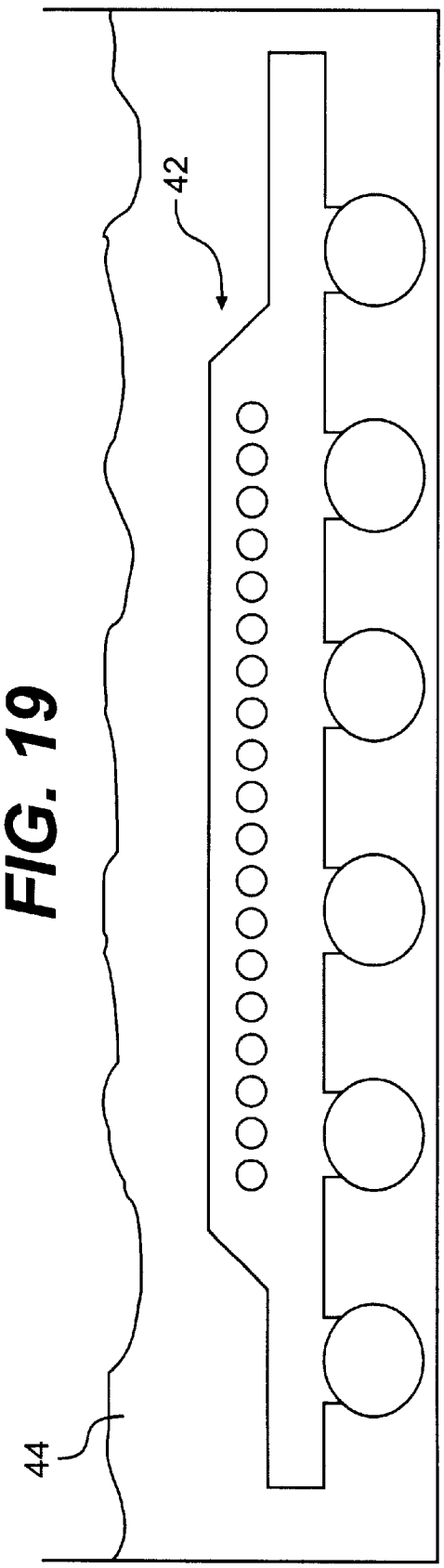
FIG. 20 is a side view of the semiconductor-chip package of FIG. 19 being cleaned in a solvent such as de-ionized water.

As embodied herein and shown in FIG. 18, in any of the three embodiments involving the use of pre-formed solder balls, the combined die 30, substrate 22, and package bumps 34 may be lifted from the pallet 10 or may be left in. This pre-underfilled semiconductor-chip package 38 is functional, mechanically and electrically. In other words, in this form, the die 30 is capable of functioning in the electrical or electronic product in which it is to be used. The package can be underfilled, as shown in FIG. 19, and/or overfilled, however, to make it more durable. FIG. 19 shows the combined die 30, substrate 22, and package bumps 34, with the addition of underfill 40 filling the gaps between the die 30 and the substrate 22. At this point, the semiconductor-chip package 42 is complete and can be cleaned in some solvent 44, such as de-ionized water, as shown in FIG. 20.

It will be apparent to those skilled in the art that various modifications and variations can be made to the structure and methodology of the present invention without departing from the scope or spirit of the invention. For example, the size, number, and arrangement of pockets 12 may vary from pallet to pallet and, therefore, the present invention is not limited to preferred embodiments illustrated herein. Thus, the present invention covers modifications and variations of this invention that fall within the scope of the following claims and their equivalents.

What is claimed is:

1. A method for attaching a substrate to a semiconductor chip, the method comprising the steps of:
   providing a plate having pockets;
   placing the conductive material into the pockets of the plate;
   providing a substrate having conductive pads and an alignment indicator;
   placing the substrate onto the plate by using the alignment indicator of the substrate so that the conductive pads are aligned with corresponding pockets of the plate;
   placing the semiconductor chip onto another side of the substrate; and
   simultaneously heating the plate, conductive material, substrate, and semiconductor chip.

2. The method of claim 1, wherein the pockets extend partially into the plate.

3. The method of claim 1, wherein the conductive materials comprise solder paste.

4. The method of claim 1, wherein the conductive materials comprise solder balls.

5. The method of claim 4, wherein the solder balls are mixed in flux prior to being placed in the pockets.

6. The method of claim 4, wherein the solder balls are placed into the pockets and an adhesive substance is applied over the solder balls.

7. The method of claim 6, wherein the adhesive substance comprises tacky flux.

8. The method of claim 6, wherein the adhesive substance comprises liquid flux.

9. The method of claim 1, wherein the substrate is placed onto the conductive materials in the pockets by a pick-and-place mechanism.

10. The method of claim 1, wherein the semiconductor chip is placed onto the substrate by a pick-and-place mechanism.

11. The method of claim 1, wherein the step of placing the conductive materials into the selected pockets comprises:
   placing onto the plate a stencil having holes that register with the selected pockets on the plate and with conductive pads on the substrate; and spreading the conductive materials across the stencil so that the conductive materials moves through the holes of the stencil into the selected pockets of the plate.

12. The method of claim 11, wherein the stencil is made out of metal.

13. The method of claim 1, further comprising the step of:
removing the combined conductive materials, substrate, and semiconductor chip from the plate.

14. The method of claim 1, wherein the step of placing the substrate onto the plate comprises the steps of:
placing at least one marking onto the plate; and
using the marking to align the conductive pads on the substrate with the pockets on the plate.

15. The method of claim 1, wherein the alignment indicator of the substrate comprises a fiducial mark.

16. The method of claim 1, wherein the alignment indicator of the substrate comprises a designated pad of the substrate.

17. The method of claim 1, further comprising the step of placing an alignment indicator on the pallet, and the step of placing the substrate onto the plate includes the substep of using the alignment indicator on the pallet to align the conductive pads of the substrate with corresponding pockets of the plate.

18. The method of claim 17, wherein the alignment indicator on the pallet comprises a fiducial mark.

19. The method of claim 17, wherein the alignment indicator on the pallet comprises an empty pocket of the plate.

20. The method of claim 17, wherein the alignment indicator on the pallet comprises a full pocket of the plate.

21. The method of claim 1, further comprising the step of:
applying a non-conductive bonding material between the substrate and the semiconductor chip.

22. The method of claim 1, further comprising the step of:
applying a non-conductive bonding and abrasive-resistant substance over the combined conductive materials, substrate, semiconductor chip and non-conductive bonding material.

23. The method of claim 21, further comprising the step of:
applying a non-conductive bonding and abrasive-resistant substance over the combined conductive materials, substrate, semiconductor chip and non-conductive bonding material.

24. The methods of claims 21, 22, or 23, further comprising the step of:
cleaning the combined conductive materials, substrate, and conductive chip.

25. The method of claim 3, wherein the step of providing a plate having pockets comprises the substep of forming each of the pockets into a substantially cylindrical shape, and the step of placing the conductive material into the pockets comprises the substep of forming a substantially cylindrical solder paste structure within each of the pockets.

26. The method of claim 1, wherein the step of placing the substrate onto the plate includes the substep of visually aligning the alignment indicator of the substrate to align the conductive pads of the substrate with corresponding pockets of the plate.

27. The method of claim 11, wherein the step of placing the stencil onto the plate comprises the substeps of placing a marking on the plate, and visually aligning the marking on the plate relative to the stencil.

28. A method for attaching conductive material to conductive pads on one side of a substrate and for attaching a semiconductor chip to the other side of said substrate, the method comprising the steps of:
providing a plate having pockets;
placing the conductive material into said pockets;
placing the substrate onto said plate so that said conductive pads are aligned with corresponding pockets;
placing said semiconductor chip onto the other side of said substrate;
simultaneously heating said plate, conductive material, substrate, and semiconductor chip; and
wherein the step of placing the substrate onto the plate includes the substeps of placing at least one marking onto the plate, and using the marking on the plate to align the conductive pads on the substrate with the selected pockets on the plate.

29. The method of claim 28, wherein the substep of using marking on the plate comprises visually aligning the marking on the plate relative to the substrate.

30. A method for attaching conductive material to conductive pads on one side of a substrate and for attaching a semiconductor chip to the other side of said substrate, the method comprising the steps of:
providing a plate having pockets;
placing the conductive material into said pockets;
placing the substrate onto said plate so that said conductive pads are aligned with corresponding pockets;
placing said semiconductor chip onto the other side of said substrate;
simultaneously heating said plate, conductive material, substrate, and semiconductor chip; and
wherein the step of placing the semiconductor chip onto the substrate includes the substeps of placing at least one marking onto the substrate, and using the marking on the substrate to align the conductive pads on the other side of the substrate with the solder bumps on the semiconductor chip.

31. A method for attaching conductive material to conductive pads on one side of a substrate and for attaching a semiconductor chip to the other side of said substrate, the method comprising the steps of:
providing a plate having pockets;
placing the conductive material into said pockets;
placing the substrate onto said plate so that said conductive pads are aligned with corresponding pockets;
placing said semiconductor chip onto the other side of said substrate;
simultaneously heating said plate, conductive material, substrate, and semiconductor chip; and
wherein the step of providing a plate having pockets further comprises the step of providing passageways in the plate configured to provide vacuum force to the conductive materials in the pockets.

32. The method of claim 31, wherein the passageways are arranged to hold the conductive materials in the pockets.

33. The method of claim 31, wherein the step of placing the substrate onto the plate comprises the substeps of marking the substrate, and visually aligning the marking of the substrate relative to the plate.

34. The method of claim 31, wherein the step of placing the semiconductor chip onto the substrate comprises the substeps of marking the substrate, and visually aligning the marking on the substrate relative to the semiconductor chip.

35. A method for attaching conductive material to conductive pads on one side of a substrate and for attaching a semiconductor chip to the other side of said substrate, the method comprising the steps of:

providing a plate having pockets;

placing the conductive material into the pockets;

applying a flux substance over the conductive material placed in the pockets of the plate;

placing the substrate onto the plate so that the conductive pads are aligned with corresponding pockets;

placing the semiconductor chip onto the other side of said substrate; and simultaneously heating the plate, conductive material, substrate, and semiconductor chip.

36. The method of claim 35, wherein the flux substance is tacky.

37. The method of claim 35, wherein the flux substance is liquid.

38. The method of claim 35, further comprising the step of providing a substrate having conductive pads and an alignment indicator, and wherein the step of placing the substrate onto the plate includes the substep of using the alignment indicator of the substrate to align the conductive pads of the substrate with corresponding pockets of the plate.

39. The method of claim 38, wherein the alignment indicator of the substrate comprises a fiducial mark.

40. The method of claim 38, wherein the alignment indicator of the substrate comprises a designated pad of the substrate.

41. The method of claim 38, further comprising the step of placing an alignment indicator on the plate, and the step of placing the substrate onto the plate includes the substep of using the alignment indicator on the plate to align the conductive pads of the substrate with corresponding pockets of the plate.

42. The method of claim 41, wherein the alignment indicator comprises a fiducial mark.

43. The method of claim 41, wherein the alignment indicator comprises an empty pocket of the plate.

44. The method of claim 41, wherein the alignment indicator comprises a full pocket of the plate.

45. The method of claim 35, further comprising the step of preventing the conductive material in the pocket of the plate from moving after the step of placing the conductive material into the pockets.

46. The method of claim 35, further comprising the step of providing a channel connected to one of the pockets of the plate.

47. The method of claim 46, wherein the channel is arranged to apply vacuum force to conductive material in the pocket.

48. The method of claim 38, wherein the step of using the alignment indicator of the substrate comprises visually aligning the alignment indicator on the substrate relative to the plate.

49. The method of claim 41, wherein the step of using the alignment indicator on the plate comprises visually aligning the alignment indicator on the plate relative to the alignment indicator of the substrate.

50. A method for attaching a semiconductor chip to a substrate comprising:

providing a plate having at least one cylindrical pocket;

placing solder paste into the pocket so as to form a substantially cylindrical solder paste structure;

placing the substrate onto the plate so that a conductive pad on a first side of the substrate is aligned with the pocket;

placing the semiconductor chip onto the substrate so that a solder bump on the semiconductor chip is aligned with a conductive pad on a second side of the substrate; and simultaneously heating the plate, the substantially cylindrical solder paste structure, the substrate, and the solder bump on the semiconductor chip so as to connect the semiconductor chip to the substrate.

51. The method of claim 50, further comprising the step of applying a flux substance over the solder paste placed in the pocket of the plate.

52. The method of claim 50, further comprising the step of providing an alignment indicator on the substrate, and wherein the step of placing the semiconductor chip onto the substrate comprises the substep of using the alignment indicator on the substrate to align the conductive pads of the substrate with the pocket of the plate.

53. The method of claim 50, wherein the step of providing a plate further comprises the step of providing a channel connected to the pocket.

54. The method of claim 52, wherein the step of using the alignment indicator on the substrate comprising visually aligning the alignment indicator on the substrate relative to the plate.

55. The method of claim 54, wherein the step of placing the semiconductor chip onto the substrate comprises visually aligning the alignment indicator on the substrate relative to the semiconductor chip.

56. The method of claim 30, wherein the substep of using the marking on the substrate comprises visually aligning the marking on the substrate relative to the semiconductor chip.

* * * * *

UNITED STATES PATENT AND TRADEMARK OFFICE
CERTIFICATE OF CORRECTION

PATENT NO.    : 6,484,927 B1
DATED         : November 26, 2002
INVENTOR(S)   : James K. Adriance et al.

It is certified that error appears in the above-identified patent and that said Letters Patent is hereby corrected as shown below:

Column 13,
Line 2, change "materials moves" to -- materials move --.

Signed and Sealed this

Fourth Day of March, 2003

JAMES E. ROGAN
*Director of the United States Patent and Trademark Office*